United States Patent
Chakihara et al.

(10) Patent No.: US 8,546,867 B2
(45) Date of Patent: Oct. 1, 2013

(54) NON-VOLATILE MEMORY SEMICONDUCTOR DEVICE

(71) Applicant: Renesas Electronics Corporation, Kawasaki (JP)

(72) Inventors: Hiraku Chakihara, Tokyo (JP); Tsutomu Okazaki, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/732,235

(22) Filed: Dec. 31, 2012

(65) Prior Publication Data

US 2013/0119454 A1    May 16, 2013

Related U.S. Application Data

(63) Continuation of application No. 12/558,502, filed on Sep. 12, 2009, now Pat. No. 8,357,968.

(30) Foreign Application Priority Data

Sep. 30, 2008    (JP) .................................. 2008-254829

(51) Int. Cl.
*H01L 29/792* (2006.01)
*G11C 11/34* (2006.01)

(52) U.S. Cl.
USPC ........... 257/316; 257/314; 257/315; 257/321; 257/324; 257/E21.21; 257/E21.423; 257/E21.679; 257/E27.103; 257/E29.309

(58) Field of Classification Search
USPC ............ 257/314, 315, 316, 321, 324, E21.21, 257/E21.423, E21.679, E27.103, E29.309
See application file for complete search history.

(56) References Cited

U.S. PATENT DOCUMENTS

| | | | | |
|---|---|---|---|---|
| 7,245,531 | B2 * | 7/2007 | Okazaki et al. | 365/185.05 |
| 7,863,131 | B2 | 1/2011 | Yasui et al. | |
| 2004/0129972 | A1 * | 7/2004 | Kasuya | 257/324 |
| 2006/0035435 | A1 | 2/2006 | Yasui et al. | |
| 2007/0164342 | A1 | 7/2007 | Okazaki et al. | |

FOREIGN PATENT DOCUMENTS

| | | |
|---|---|---|
| JP | 2006-49737 A | 2/2006 |
| JP | 2006-54292 A | 2/2006 |
| JP | 2007-189063 A | 7/2007 |

OTHER PUBLICATIONS

Office Action issued Aug. 13, 2012, in Chinese Patent Application No. 200910148900X.

* cited by examiner

*Primary Examiner* — Matthew W Such
*Assistant Examiner* — David Spalla
(74) *Attorney, Agent, or Firm* — Miles & Stockbridge P.C.

(57) ABSTRACT

A technique capable of improving the reliability of a non-volatile memory semiconductor device is provided and, in particular, a technique capable of supplying electricity without fail to a memory gate electrode of split gate transistor is provided.
One end of an electricity supply line ESL is arranged over a terminal end TE1 and the other end thereof is arranged over a terminal end TE2, and further, the central portion of the electricity supply line ESL is arranged over a dummy part DMY. That is, the terminal end TE1, the terminal end TE2, and the dummy part DMY have substantially the same height, and therefore, most of the electricity supply line ESL arranged from over the terminal end TE1 to over the terminal end TE2 via the dummy part DMY is formed so as to have the same height.

9 Claims, 30 Drawing Sheets

NON-VOLATILE MEMORY SEMICONDUCTOR DEVICE

CROSS-REFERENCE TO RELATED APPLICATION

The disclosure of Japanese Patent Application No. 2008-254829 filed on Sep. 30, 2008 including the specification, drawings and abstract is incorporated herein by reference in its entirety.

BACKGROUND OF THE INVENTION

The present invention relates to a non-volatile memory semiconductor device and, in particular, to a technique effective when applied to a non-volatile memory semiconductor device including a memory cell in which a memory gate electrode is formed on the sidewall of a control gate electrode via an insulating film.

In Japanese patent laid-open No. 2006-49737 (patent document 1), a technique is described, which improves manufacturing yield as well as improving the performance of a semiconductor device. Specifically, a plurality of memory cells is arranged in an array and a selection gate electrode of the memory cell arranged side by side in a first direction (x direction) is connected by a selection gate line and a memory gate electrode is connected by a memory gate line. The memory gate lines respectively connected with the memory gate electrodes of the adjoining memory cells via a source region are not electrically connected with each other. The selection gate line has a first part extending in the first direction (x direction) and a second part having one end connected with the first part and extending in a second direction (y direction). The memory gate line is formed on the sidewall of the selection gate line via an insulating film and has a contact part extending in the first direction (x direction) from over the second part of the selection gate line to over an element isolation region, and is connected with a wire via a plug to fill a contact hole formed over the contact part.

In Japanese patent laid-open No. 2006-54292 (patent document 2), a technique is described, which is capable of making an attempt to reduce the manufacturing time and the cost by reducing the number of additional masks necessary to mount a nonvolatile memory mixedly in a standard CMOS logic process. Specifically, a sidewall structure is utilized and in a memory cell of split gate type in which a gate electrode has been silicidized, a standalone auxiliary pattern is arranged adjoining a selection gate electrode. A gap between the both is filled with polysilicon of a sidewall gate to form a wire part in a self-alignment manner, and a contact is provided to the wire part. The contact may overlap the auxiliary pattern and an element isolation region and it is possible to optimize its design while taking into consideration an occupied area.

In Japanese patent laid-open No. 2007-189063 (patent document 3), a technique is described, which provides a memory semiconductor device capable of making an attempt to extend a process margin and its manufacturing method. Specifically, on a polysilicon film constituting a memory gate wire etc., a part is formed, which extends from a part located on one of side surfaces of a control gate wire to the opposite side of a side on which the control gate wire is located and the part is used as a pad part. A contact hole is formed so as to expose the pad part. The height of the part of the polysilicon film located on one of the side surfaces of the control gate wire is set not more than the height of the control gate wire and the polysilicon film constituting the memory gate wire etc. does not overlap the control gate wire in a planar manner.

SUMMARY OF THE INVENTION

As a non-volatile memory semiconductor device capable of being electrically written and erased, an EEPROM (Electrically Erasable and Programmable Read Only Memory) and a flash memory are widely used. Such a non-volatile memory semiconductor device (memory) represented by an EEPROM and a flash memory widely used currently has a conductive floating gate electrode surrounded by a silicon oxide film and a charge storage film such as a trap insulating film, under a gate electrode of a MOS (Metal Oxide Semiconductor) transistor, and information is stored by making use of a difference in threshold value of the transistor depending on the charge storage state of the floating electrode and the trap insulating film.

The trap insulating film refers to an insulating film having a trap level at which charges can be stored, and as an example, mention is made of a silicon nitride film. A non-volatile memory semiconductor device having a trap insulating film is caused to operate as a memory element by injecting/discharging charges into/from the trap insulating film to shift the threshold value of a MOS transistor. A non-volatile memory semiconductor device having such a trap insulating film as a charge storage film is called a MONOS (Metal Oxide Nitride Oxide Semiconductor) transistor and excellent in the reliability of data holding compared to the case where a conductive floating gate electrode is used as a charge storage film because charges are stored at discrete trap levels. In addition, because of the excellent reliability of data holding, there is an advantage that the thickness of the silicon oxide film over and under the trap insulating film can be reduced, the voltage required for the write/erase operation can also be reduced, etc.

As an example of a MONOS transistor, mention is made of a split gate transistor. The split gate transistor has a structure in which a memory gate electrode having a sidewall shape is formed on the sidewall of a control gate electrode via an insulating film. The non-volatile memory semiconductor device has a structure in which the above-described split gate transistor is adopted as a memory cell and the memory cell is arranged in an array. Specifically, part of the layout of the non-volatile memory semiconductor device is, for example, such that a first memory cell array region, an electricity supply region, and a second memory cell array region are arranged side by side along a first direction (x direction). At this time, for example, the electricity supply region is arranged sandwiched by the first memory cell array region and the second memory cell array region. The electricity supply region is a region used to supply a voltage to the memory cell formed in the memory cell array region. Specifically, the region is used to supply a voltage to the control gate electrode and the memory gate electrode of the split gate transistor constituting the memory cell.

The configuration of the first memory cell array region, the second memory cell array region, and the electricity supply region described above will be described. First, a first control gate electrode extending along the first direction (x direction) from the first memory cell array region to the electricity supply region is formed. Then, a pedestal part extending along the first direction (x direction) within the electricity supply region and electrically connected with the first control gate electrode is arranged. Further, a second control gate electrode extending along the first direction (x direction) from the electricity supply region to the second memory cell array region and electrically connected with the pedestal part within the electricity supply region is arranged. At this time, the first control gate electrode, the pedestal part, and the second control gate electrode are arranged in a straight line as a result. A memory gate electrode having a sidewall shape, which extends in the first direction (x direction), is formed via an insulating film on the respective sidewalls of the first control gate electrode, the pedestal part, and the second control gate electrode arranged in a straight line.

The configuration to supply a voltage to the memory gate electrode in the electricity supply region will be described. In the electricity supply region, the memory gate electrode is formed on the sidewall of the pedestal part. To the memory gate electrode, an electricity supply line is electrically connected. Specifically, the electricity supply line is formed along a second direction (y direction) so that one end of the electricity supply line runs onto the pedestal part and extend from the one end to the sidewall of the pedestal part, and further the other end is drawn to an unoccupied space of the semiconductor substrate that serves as a front-end of the pedestal part. Due to this, the electricity supply line is electrically connected with the memory gate electrode formed on the sidewall of the pedestal part. Then, the other end of the electricity supply line, which is arranged in the unoccupied space of the semiconductor substrate, is connected with a plug and thus connected with a wire in the upper layer. Due to this, it is possible to supply a voltage to the memory gate electrode via the electricity supply line.

The electricity supply line is formed by processing a polysilicon film constituting the memory gate electrode. That is, the memory gate electrode is formed as a sidewall on the sidewall of the control gate electrode (including the pedestal part) by forming a polysilicon film over the semiconductor substrate over which the control gate electrode (including the pedestal part) is formed via an insulating film and subjecting the polysilicon film to anisotropic etching. The electricity supply line is formed at the same time in the process for forming the memory gate electrode. That is, in the electricity supply region, etching is performed in a state where the polysilicon film constituting the memory gate electrode is patterned into the pattern of the electricity supply line. Due to this, in the electricity supply region, it is possible to form the memory gate electrode having a sidewall shape on the sidewall of the pedestal part and, at the same time, to form the electricity supply line from the same polysilicon film as that which constitutes the memory gate electrode.

The electricity supply line is patterned by forming a resist film over the polysilicon film, then patterning the resist film using the photolithography technique, and performing etching using the patterned resist film as a mask. One end of the electricity supply line runs onto the pedestal part and the other end is arranged over the semiconductor substrate that serves as a front-end of the pedestal part, and therefore, the electricity supply line is formed extending across a step made by the pedestal part vertically as a result. Consequently, the resist film that forms the electricity supply line is also patterned on the step made by the pedestal part. This means that it becomes difficult to focus on both resist films formed over and under the step when performing exposure processing of the resist film. That is, the height of the pedestal part is the same as that of the control gate electrode, comparatively high, and therefore, the focus depth of an image forming optical system for forming exposure light into an image is exceeded. Because of this, if the resist film formed over the pedestal part is focused on, the resist film formed over the semiconductor substrate (front-end) is not focused on and conversely, if the resist film formed over the semiconductor substrate (front-end) is focused on, the resist film formed over the pedestal part is not focused on.

In this case, the situation is such that the polysilicon film is etched using the patterned resist film as a mask after patterning the resist film in the out-of-focus state. That is, the patterning of the polysilicon film using the resist film as a mask is not performed normally and there occurs the defect in the shape of the electricity supply line obtained by processing the polysilicon film. For example, the other end of the electricity supply line formed over the semiconductor substrate (front-end) is ground excessively, and as a result, is not connected with the plug with which the other end of the electricity supply line should be connected. That is, due to the defect in the shape of the electricity supply line, there occurs a defect in connection between the electricity supply line and the plug. If the electricity supply line and the plug are brought into non-conductive state, it is no longer possible to supply a voltage from outside to the memory gate electrode via the electricity supply line. That is, it is no longer possible to supply a voltage to the memory gate electrode, and therefore, it is no longer possible to write/erase data to/from the memory cell, and thus the reliability of the non-volatile memory semiconductor device is degraded.

An object of the present invention is to provide a technique capable of improving the reliability of a non-volatile memory semiconductor device and, in particular, to provide a technique capable of supplying electricity without fail to the memory gate electrode of a split gate transistor.

The other purposes and the new feature of the present invention will become clear from the description of the present specification and the accompanying drawings.

The following explains briefly the outline of a typical invention among the inventions disclosed in the present application.

A non-volatile memory semiconductor device according to a typical embodiment comprises a first memory cell array region, a second memory cell array region, and an electricity supply region sandwiched by the first memory cell array region and the second memory cell array region over a semiconductor substrate, wherein the first memory cell array region, the second memory cell array region, and the electricity supply region are arranged side by side in a first direction. Then, the non-volatile memory semiconductor device has (a) a first control gate electrode extending along the first direction from the first memory cell array region to the electricity supply region and having a first terminal end within the electricity supply region and (b) a first memory gate electrode formed on the sidewall of the first control gate electrode via a first insulating film and extending in the first direction. The non-volatile memory semiconductor device further has (c) a second control gate electrode extending along the first direction from the second memory cell array region to the electricity supply region and having a second terminal end within the electricity supply region and (d) a second memory gate electrode formed on the sidewall of the second control gate electrode via a second insulating film and extending in the first direction. At this time, the first control gate electrode and the second control gate electrode are arranged in a straight line and the first terminal end and the second terminal end are arranged separated from each other. Here, the non-volatile memory semiconductor device further comprises (e) an electricity supply line with one end arranged over the first terminal end and the other end arranged over the second terminal end and (f) a plug electrically connected with the electricity supply line. Then, the electricity supply line is formed by processing a first conductive film forming the first memory gate electrode and the second memory gate electrode and the first memory gate electrode and the second memory gate electrode are electrically connected via the electricity supply line. Then, a predetermined voltage is applied to the first memory gate electrode and the second memory gate electrode via the electricity supply line.

The following explains briefly the effect acquired by the typical invention among the inventions disclosed in the present application.

It is possible to improve the reliability of a non-volatile memory semiconductor device. In particular, it is possible to supply electricity to the memory gate electrode of a split gate transistor without fail.

DETAILED DESCRIPTION OF THE PREFERRED EMBODIMENTS

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc.

Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

In all the drawings for explaining embodiments, the same symbol is attached to the same member, as a principle, and the repeated explanation thereof is omitted. In order to make a drawing intelligible, hatching may be attached even if it is a plan view.

(First Embodiment)

First, before the explanation of a semiconductor device in a first embodiment, a technique (comparative example) the inventors of the present invention have studied will be described with reference to the drawings (FIG. 1 to FIG. 11). Specifically, after the explanation of a structure in the comparative example, the problem of the comparative example will be described while explaining a manufacturing process of the structure.

Figure 1:
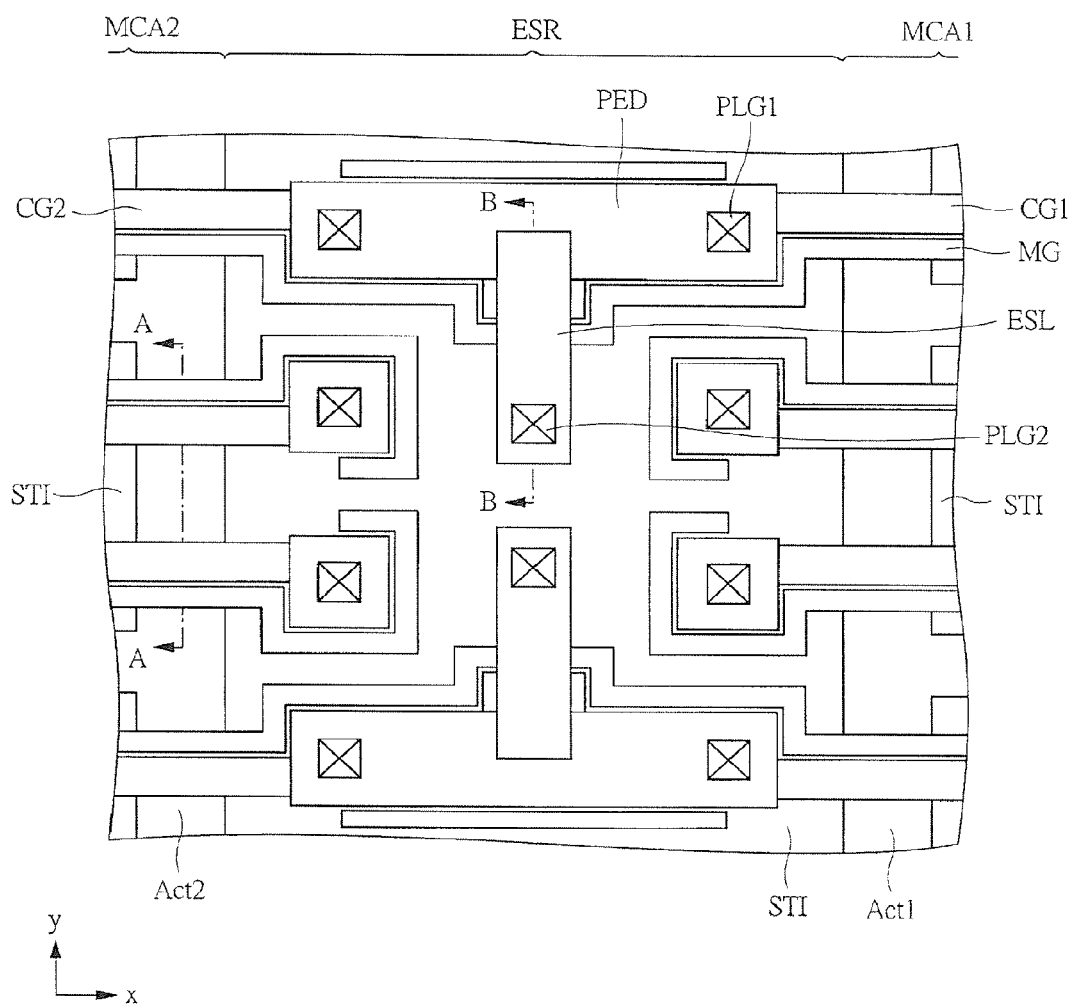
FIG. 1 is a diagram showing a layout configuration of a non-volatile memory semiconductor device in a comparative example the inventors of the present invention have studied.

FIG. 1 is a plan view showing part of a layout configuration of a non-volatile memory semiconductor device in the comparative example. As shown in FIG. 1, in the non-volatile memory semiconductor device in the comparative example, for example, a memory cell array region MCA1 and a memory cell array region MCA2 are arranged along an x-axis direction and an electricity supply region (shunt region) ESR is arranged so as to be sandwiched by the memory cell array region MCA1 and the memory cell array region MCA2. The memory cell array regions MCA1, MCA2 are a region in which memory cells are formed in an array and the electricity supply region ESR is a region used to supply a voltage to the memory cell array regions MCA1, MCA2. That is, it is necessary to apply a predetermined voltage to the memory cell at the time of write operation, erase operation, and read operation, and because of this, the electricity supply region ESR is provided in order to supply a predetermined voltage to the memory cell when performing these operations.

The configuration of the memory cell array region MCA, the memory cell array region MCA2, and the electricity supply region ESR in the above-described comparative example will be first described. In the memory cell array region MCA1, an active region Act1 defined by an element isolation region STI is formed and in the active region Act1, a plurality of memory cells is formed. Similarly, in the memory cell array region MCA2 also, an active region Act2 defined by the element isolation region STI is formed and a plurality of memory cells is formed in the active region Act2. On the other hand, the element isolation region STI is formed across the entire interior of the semiconductor substrate of the electricity supply region ESR.

Along the x-axis direction, a control gate electrode CG1 extending from the memory cell array region MCA1 to the electricity supply region ESR is formed. Then, a pedestal part PED is arranged, which extends along the x-axis direction within the electricity supply region ESR and is electrically connected with the control gate electrode CG1. Further, a control gate electrode CG2 is arranged, which extends along the x-axis direction from the electricity supply region ESR to the memory cell array region MCA2 and is electrically connected with the pedestal part PED within the electricity supply region ESR. At this time, the control gate electrode CG1, the pedestal part PED, and the control gate electrode CG2 are arranged in a straight line. On the respective sidewalls of the control gate electrode CG1, the pedestal part PED, and the control gate electrode CG2 arranged in a straight line, a memory gate electrode MG having a sidewall shape and extending in the x-axis direction is formed via an insulating film.

The configuration to supply a voltage to the memory gate electrode MG in the electricity supply region ESR will be described. In the electricity supply region ESR, the memory gate electrode MG is formed on the sidewall of the pedestal part PED. To the memory gate electrode MG, an electricity supply line ESL is electrically connected. Specifically, the electricity supply line ESL is formed along a y-axis direction so that one end of the electricity supply line ESL runs onto the pedestal part PED and extends from the one end to the sidewall of the pedestal part PED, and further the other end is drawn into an unoccupied space of the semiconductor substrate that serves as a front-end of the pedestal part PED. Due to this, the electricity supply line ESL is electrically connected with the memory gate electrode MG formed on the sidewall of the pedestal part PED. Then, the other end of the electricity supply line ESL, which is arranged in the unoccupied space of the semiconductor substrate, is connected with a plug PLG2 and thus connected with a wire in the upper layer. In addition, the electricity supply line ESL is formed so as to have a width greater than that of the memory gate electrode MG having a sidewall shape (length in the direction of gate length of the memory gate electrode MG). That is, the electricity supply line ESL is a region that has a width greater than that of the memory gate electrode MG used in a memory cell array region MCA. More specifically, the electricity supply line ESL is formed so as to have a width greater than the diameter of a plug PLG1. Due to this, it is possible to supply a voltage to the memory gate electrode MG via the electricity supply line ESL. In addition, it is designed so that the control gate electrodes CG1, CG2 can supply a voltage by the plug PLG1 that reaches the pedestal part PED.

The layout configuration of the non-volatile memory semiconductor device in the comparative example is made as described above and next, the configuration of the memory cell formed in the memory cell array regions MCA1, MCA2 shown in FIG. 1 and the configuration of the electricity supply line ESL formed in the electricity supply region ESR will be described below.

Figure 2:
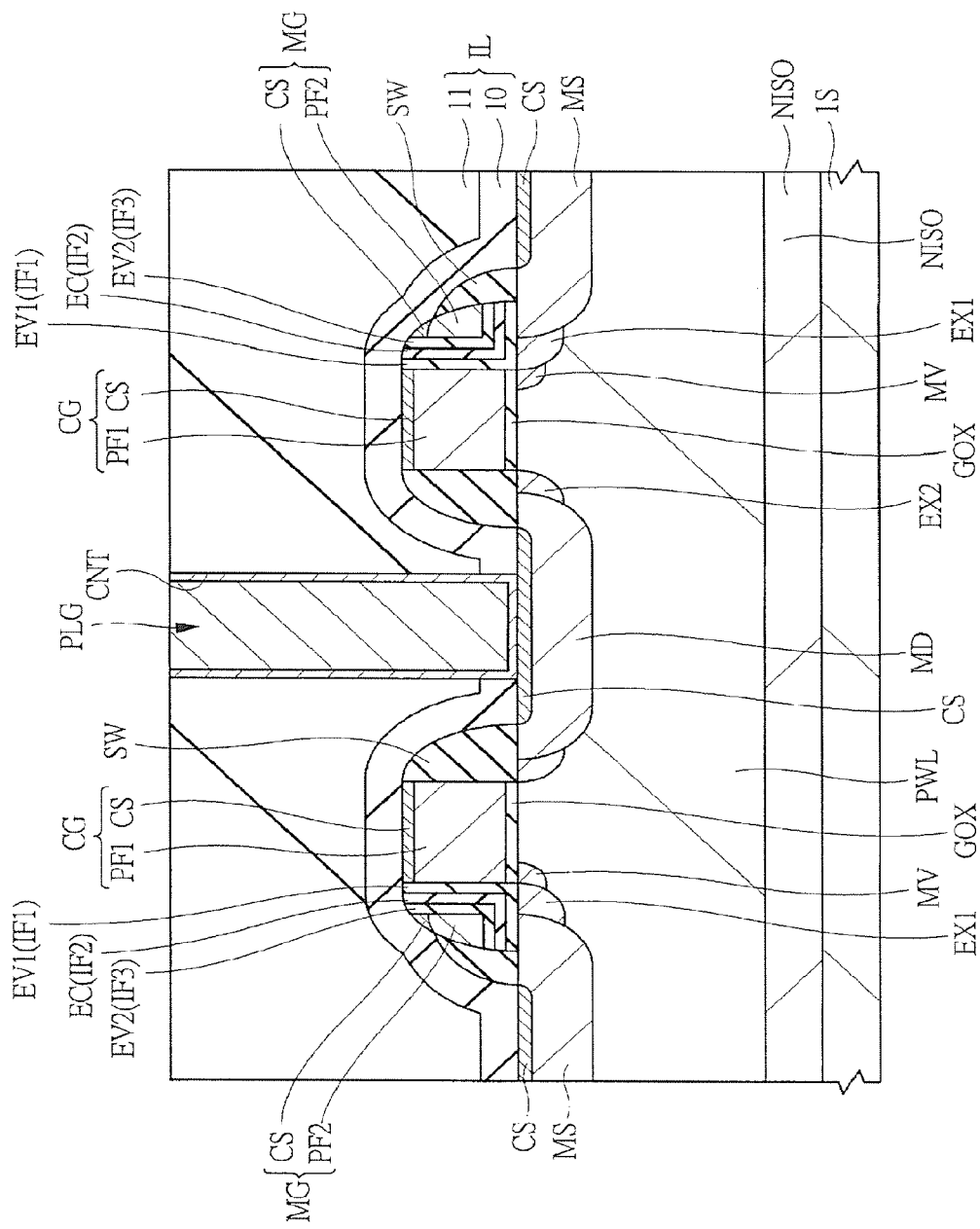
FIG. 2 is a section view cut by A-A line in FIG. 1.

FIG. 2 is a section view cut along A-A line in FIG. 1, showing the configuration of the memory cell. Here, the configuration of the memory cell in the comparative example will be described, however, the configuration of the memory cell is the same as that of the memory cell in a first embodiment, to be described later. Consequently, in this specification, the configuration of the memory cell will be described as a comparative example, however, it can be said that the configuration and operation of the memory cell shown in FIG. 2 are the same as those of the memory cell in the first embodiment. That is, the difference between the comparative example and the first embodiment lies not in the configuration of the memory cell, but in the configuration of the electricity supply region ESR that supplies a voltage to the memory cell.

As shown in FIG. 2, in the memory cell formation region, a well isolation layer NISO including an n-type semiconductor region is formed over a semiconductor substrate 1S and over the well isolation layer NISO, a p-type well PWL is formed. Then, the memory cell is formed over the p-type well PWL. The memory cell includes a selection part that selects a memory cell and a storage part that stores information. First of all, the configuration of the selection part that selects a memory cell will be described. The memory cell has a gate insulating film GOX formed over the semiconductor substrate 1S (p-type well PWL) and over the gate insulating film GOX, a control gate electrode (control electrode) CG is formed. The gate insulating film GOX is formed from, for example, a silicon oxide film, and the control gate electrode CG is formed from, for example, a polysilicon film PF1 and a cobalt silicide film CS formed over the polysilicon film PF1. The cobalt silicide film CS is formed for the purpose of reducing the resistance of the control gate electrode CG. The control gate electrode CG has a function to select a memory cell. That is, a specific memory cell is selected by the control gate electrode CG and the write operation, the erase operation, and the read operation are performed on the selected memory cell. In the present embodiment, the cobalt silicide film CS is shown as an example of a silicide film, however, this is not limited and it may also be possible to use other films, such as nickel silicide or platinum silicide. This also applies to the cobalt silicide film CS in the following description.

Next, the configuration of the storage part of the memory cell will be described. On one of the sidewalls of the control gate electrode CG, the memory gate electrode MG is formed via a laminated film including an insulating film. The memory gate electrode MG has a sidewall shape formed on one of the sidewalls of the control gate electrode CG and is formed from a polysilicon film PF2 and the cobalt silicide film CS formed over the polysilicon film PF2. The cobalt silicide film CS is formed for the purpose of reducing the resistance of the memory gate electrode MG.

A laminated film is formed between the control gate electrode CG and the memory gate electrode MG and between the memory gate electrode MG and the semiconductor substrate 1S. The laminated film includes a potential barrier film EV1 formed over the semiconductor substrate 1S, a charge storage film EC formed over the potential barrier film EV1, and a potential barrier film EV2 formed over the charge storage film EC. The potential barrier film EV1 is formed from, for example, a silicon oxide film IF1 and functions as a gate insulating film formed between the memory gate electrode MG and the semiconductor substrate 1S. The potential barrier film formed from the silicon oxide film IF1 also has a function as a tunnel insulating film. For example, the storage part of the memory cell injects electrons to the charge storage film EC from the semiconductor substrate 1S via the potential barrier film EV1, or injects holes to the charge storage film EC to store or erase information, and therefore, the potential barrier film EV1 functions as a tunnel insulating film. The potential barrier film EV1 is not limited to the silicon oxide film and it may also be possible to form it from a silicon oxide film into which nitrogen has been introduced.

Then, the charge storage film EC formed over the potential barrier film EV1 has a function to store charges. Specifically, in the comparative example, the charge storage film EC is formed from a silicon nitride film IF2. The storage part of the memory cell in the comparative example stores information by controlling a current that flows through the semiconductor substrate 1S under the memory gate electrode MG depending on the presence/absence of charges stored in the charge storage film EC. That is, information is stored by making use of the change of the threshold voltage of the current that flows through the semiconductor substrate 1S under the memory gate electrode MG depending on the presence/absence of charges stored in the charge storage film EC.

In the comparative example, an insulating film having a trap level is used as the charge storage film EC. As an example of the insulating film having a trap level, mention is made of the silicon nitride film IF2, however, not limited to the silicon nitride film IF2, and for example, a high-k dielectric film having a dielectric constant higher than that of a silicon nitride film, such as an aluminum oxide film (alumina), a hafnium oxide film, and a tantalum oxide film, may be used. When an insulating film having a trap level is used as the charge storage film EC, charges are captured at the trap level formed in the insulating film. In this manner, by capturing charges at the trap level, charges are stored in the insulating film.

Conventionally, a polysilicon film is used mainly as the charge storage film EC, however, when a polysilicon film is used as the charge storage film EC, if there is a defect in part of the potential barrier film EV1 or the potential barrier film EV2 surrounding the charge storage film EC, there may be a case where all the charges stored in the charge storage film EC are discharged due to abnormal leak because the charge storage film EC is a conductive film.

Because of this, the silicon nitride film IF2, which is an insulator, is used as the charge storage film EC. In this case, charges that contribute to data storage are stored at discrete trap levels (capture levels) that exist in the silicon nitride film IF2. Consequently, even if a defect occurs in part of the potential barrier film EV1 or the potential barrier film EV2 surrounding the charge storage film EC, it is unlikely that all the charges are discharged from the charge storage film EC because charges are stored at the discrete trap levels in the charge storage film EC. As a result, it is possible to improve the reliability of data holding.

For the above reason, it is possible to improve the reliability of data holding by using a film including discrete trap levels as the charge storage film EC, not limited to the silicon nitride film IF2. Further, in the comparative example, as the charge storage film EC, the silicon nitride film IF2 excellent in the data holding properties is used. Because of this, it is possible to reduce the thickness of the potential barrier film EV1 and the potential barrier film EV2 provided in order to prevent charges from flowing out of the charge storage film EC. Due to this, there is also an advantage that the voltage required to drive the memory cell can be reduced. In addition, it may also be possible to use silicon nano-dots formed into a plurality of silicon particles as the charge storage film EC.

Next, on one of the sidewalls of the control gate electrode CG, the memory gate electrode MG is formed and on the other sidewall, a sidewall SW including a silicon oxide film is formed. Similarly, on one of the sidewalls of the memory gate electrode MG, the control gate electrode CG is formed and on the other sidewall, the sidewall SW including a silicon oxide film is formed.

Within the semiconductor substrate 1S, an n-type semiconductor region MV is formed in alignment with the control gate electrode CG, and further, within the semiconductor substrate 1S immediately under the sidewall SW, a pair of shallow low-concentration impurity diffusion regions EX1, EX2, which is an n-type semiconductor region, is formed and in an exterior region in contact with the pair of shallow low-concentration impurity diffusion regions EX1, EX2, a pair of deep high-concentration impurity diffusion regions MS, MD is formed. The deep high-concentration impurity diffusion regions MS, MD are also an n-type semiconductor region and on the surface of the high-concentration impurity diffusion regions MS, MD, the cobalt silicide film CS is formed. By the pair of low-concentration impurity diffusion regions EX1, EX2 and the pair of high-concentration impurity diffusion regions MS, MD, a source region or a drain region of the memory cell is formed. By forming the source region and the drain region by the low-concentration impurity diffusion regions EX1, EX2 and the high-concentration impurity diffusion regions MS, MD, it is possible to cause the source region and the drain region to have an LDD (Lightly Doped Drain) structure. Here, a transistor including the gate insulating film GOX, the control gate electrode CG formed over the gate insulating film GOX, and the source region and the drain region described above is referred to as a selection transistor. On the other hand, a transistor including the laminated film including the potential barrier film EV1, the charge storage film EC, and the potential barrier film EV2, the memory gate electrode MG formed over the laminated film, and the source region and the drain region described above is referred to as a memory transistor. Because of this, it can be said that the selection part of the memory cell includes a selection transistor and the storage part of the memory cell includes a memory transistor. In this manner, the memory cell is configured.

Subsequently, the wiring structure connected with the memory cell will be described. Over the memory cell, an interlayer insulating film IL including a silicon nitride film 10 and a silicon oxide film 11 is formed so as to cover the memory cell. In the interlayer insulating film IL, a contact hole CNT is formed, which penetrates through the interlayer insulating film IL and reaches the cobalt silicide film CS constituting the source region and the drain region. Within the contact hole CNT, a titanium/titanium nitride film, which is a barrier conductive film, is formed and a tungsten film is formed so as to be embedded in the contact hole CNT. In this manner, by embedding the titanium/titanium nitride film and the tungsten film in the contact hole CNT, a conductive plug PLG is formed. Then, although not shown schematically in FIG. 2, over the interlayer insulating film IL, a wire is formed and the wire and the plug PLG are electrically connected. The wire is formed from a laminated film of, for example, a titanium/titanium nitride film, an aluminum film, and a titanium/titanium nitride film.

The memory cell in the present comparative example is configured as described above and the operation of the memory cell will be described below. Here, it is assumed that a voltage to be applied to the control gate electrode CG is denoted by Vcg and a voltage to be applied to the memory gate electrode MG is denoted by Vmg. Further, voltages to be applied to the source region and the drain regions are assumed to be Vs, Vd, respectively, and a voltage to be applied to the semiconductor substrate 1S (p-type well PWL) is assumed to be Vb. Injection of electrons into a silicon nitride film, which is a charge storage film, is defined as "write" and injection of holes into the silicon nitride film is defined as "erase".

First, the write operation will be described. The write operation is performed by hot-electron writing, a so-called source side injection method. As to the write voltage, for example, the voltage Vs to be applied to the source region is set to 6 V, the voltage Vmg to be applied to the memory gate electrode MG is set to 12 V, and the voltage Vcg to be applied to the control gate electrode CG is set to 1.5 V. Then, the voltage Vd to be applied to the drain region is controlled so that the channel current at the time of the write operation has a certain set value. At this time, the voltage Vd is determined by the set value of the channel current and the threshold voltage of the selection transistor having the control gate electrode CG and it is, for example, about 1 V. The voltage Vb to be applied to the p-type well PWL (semiconductor substrate 1S) is 0 V.

The movement of charges when the write operation is performed by applying such voltages is shown. As described above, by giving a potential difference between the voltage Vs to be applied to the source region and the voltage Vd to be applied to the drain region, electrons flow through a channel region formed between the source region and the drain region. The electrons that flow through the channel region are accelerated in a channel region under the vicinity of the boundary between the control gate electrode CG and the memory gate electrode MG (between the source region and the drain region) and become hot electrons. Then, by an electric field in the vertical direction due to the positive voltage (Vmg=12 V) applied to the memory gate electrode MG, the hot electrons are injected into the silicon nitride film (charge storage film EC) under the memory gate electrode MG. The injected hot electrons are captured at a trap level in the silicon nitride film and as a result, electrons are accumulated in the silicon nitride film and thus the threshold voltage of the memory transistor rises. In this manner, the write operation is performed.

Subsequently, the erase operation will be described. The erase operation is performed by, for example, a BTBT (Band to Band Tunneling) erase that uses a band-to-band tunneling phenomenon. In the BTBT erase, for example, the voltage Vmg to be applied to the memory gate electrode MG is set to −6 V, the voltage Vs to be applied to the source region is set to 6 V, the voltage Vcg to be applied to the control gate electrode CG is set to 0 V, and 0 V is applied to the drain region. Due to this, by the voltage applied between the source region and the memory gate electrode, holes generated by the band-to-band tunneling phenomenon at the end portion of the source region are accelerated by the high voltage applied to the source region and become hot holes. Then, part of the hot holes is attracted by the negative voltage applied to the memory gate electrode MG and injected into the silicon nitride film. The injected hot holes are captured at a trap level in the silicon nitride film and thus the threshold voltage of the memory transistor decreases. In this manner, the erase operation is performed.

Next, the read operation will be described. The read operation is performed by setting the voltage Vd to be applied to the drain region to Vdd (1.5 V), the voltage Vs to be applied to the source region to 0 V, the voltage Vcg to be applied to the control gate electrode CG to Vdd (1.5 V), and the voltage Vmg to be applied to the memory gate electrode MG to Vdd (1.5 V), and by causing a current to flow in the opposite direction to that at the time of write operation. It may also be possible to perform the read operation with a current in the same direction as that at the time of write operation by replacing the voltage Vd to be applied to the drain region and the voltage Vs to be applied to the source region with each other and setting them to 0 V and 1.5 V, respectively. At this time, when the memory cell is in the write state and the threshold voltage is high, no current flows through the memory cell. On the other hand, when the memory cell is in the erase state and the threshold voltage is low, a current flows through the memory cell.

As described above, it is possible to determine whether the memory cell is in the write state or the erase state by detecting the presence/absence of a current that flows through the memory cell. Specifically, a sense amplifier is used to detect the presence/absence of a current that flows through the memory cell. For example, a reference current is used to detect the presence/absence of a current that flows through the memory cell. That is, when the memory cell is in the erase state, a read current flows at the time of read operation and this read current is compared with the reference current. The reference current is set smaller than the read current in the erase state and when the read current is found to be larger than the reference current as the result of comparison between the read current and the reference current, it is possible to determine that the memory cell is in the erase state. On the other hand, when the memory cell is in the write state, no read current flows. That is, when the read current is found to be smaller than the reference current as the result of comparison between the read current and the reference current, it is possible to determine that the memory cell is in the write state. In this manner, the read operation can be performed.

Figure 3:
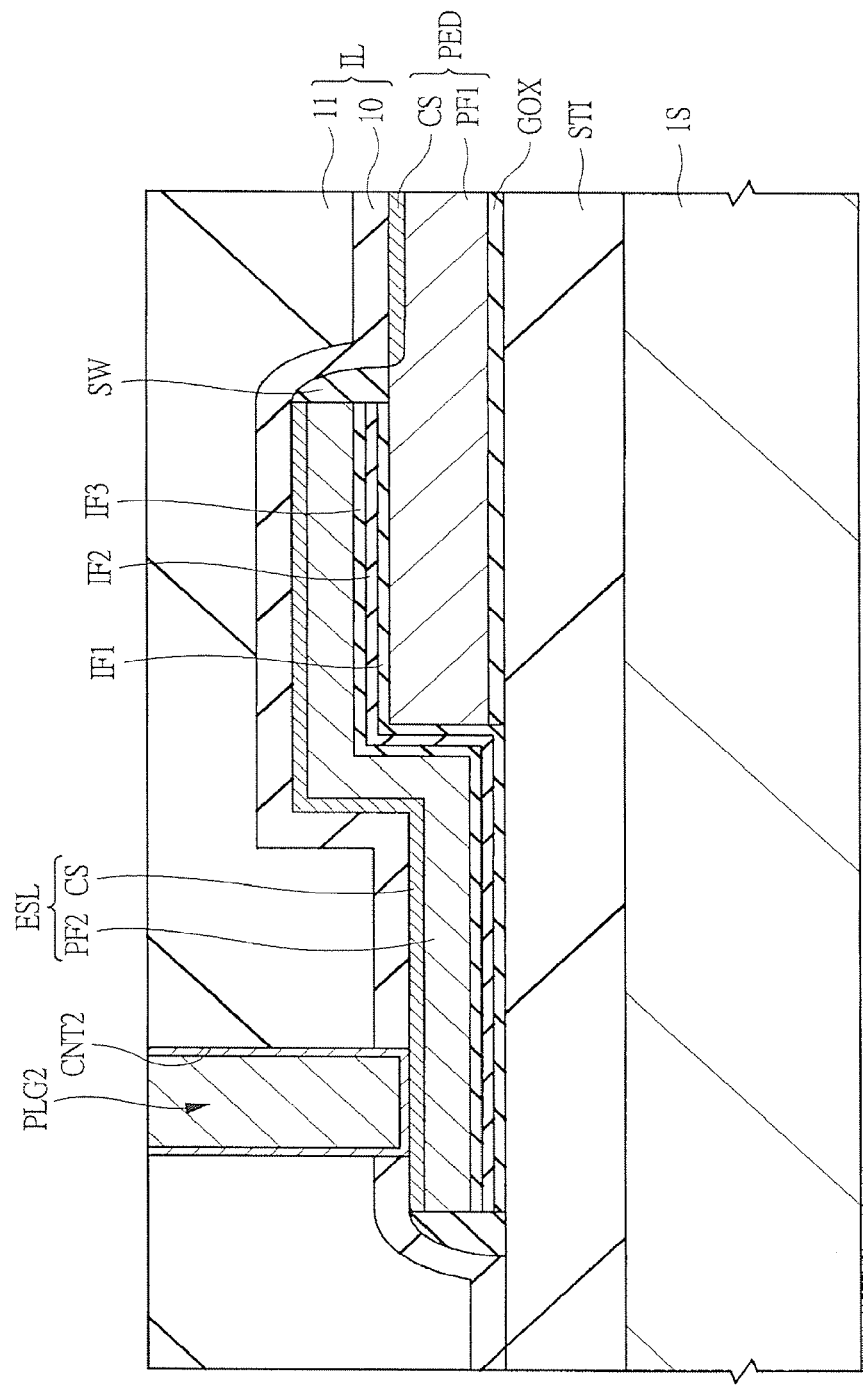
FIG. 3 is a section view cut by B-B line in FIG. 1.

Subsequently, in the comparative example, a configuration of the electricity supply line ESL formed in the electricity supply region ESR will be described. FIG. 3 is a section view cut along B-B lined in FIG. 1, showing the configuration of the electricity supply line ESL. As shown in FIG. 3, over the semiconductor substrate 1S, the element isolation region STI is formed and over the element isolation region STI, the pedestal part PED is formed via the gate insulating film GOX. The pedestal part PED is formed from a film in the same layer as the control gate electrode CG (refer to FIG. 2) of the memory cell and specifically, including a laminated film of the polysilicon film PF1 and the cobalt silicide film CS.

Then, the electricity supply line ESL is formed extending from the pedestal part PED over the semiconductor substrate in the lower layer. Specifically, the electricity supply line ESL is formed so that its one end runs onto the pedestal part PED via the laminated film including the silicon oxide film IF1, the silicon nitride film IF2, and the silicon oxide film IF3 and extends from the one end to the sidewall of the pedestal part PED and further, the other end is drawn into an unoccupied space of the semiconductor substrate 1S, which serves as a front-end of the pedestal part PED. The electricity supply line ESL is formed from a film in the same layer as the memory gate electrode MG of the memory cell shown in FIG. 2 and specifically, including the polysilicon film PF2 and the cobalt silicide film CS formed over the polysilicon film PF2. At this time, as shown in FIG. 1, the memory gate electrode MG is formed on the sidewall of the pedestal part PED, and therefore, to the memory gate electrode MG, the electricity supply line ESL is electrically connected as a result. On the sidewall of the electricity supply line ESL, the sidewall SW is formed and over the semiconductor substrate 1S including over the electricity supply line ESL, the interlayer insulating film IL is formed. The interlayer insulating film IL includes a laminated film of the silicon nitride film 10 and the silicon oxide film 11. In the interlayer insulating film IL, a contact hole CNT2 penetrating through the interlayer insulating film IL is formed and by embedding a conductive material in the contact hole CNT2, the plug PLG2 is formed. The electricity supply line ESL is connected with the plug PLG2 at the other end arranged in the unoccupied space of the semiconductor substrate 1S and connected with a wire in the upper layer. Due to this, it is possible to supply a voltage to the memory gate electrode MG via the electricity supply line ESL. As described above, the electricity supply line ESL in the comparative example is formed along the step between the semiconductor substrate 1S and the pedestal part PED, and therefore, the following problem arises. This problem will be described with a process for manufacturing the electricity supply line ESL as an example.

FIG. 4 to FIG. 11 are diagrams for illustrating a manufacturing process of the electricity supply line ESL in the comparative example and the electricity supply line ESL is formed by making use of the process for forming a memory cell to be formed in the memory cell array region. In FIG. 4 to FIG. 11, in the left-hand side region, the memory cell array region MCA is shown and in the right-hand side region, the electricity supply region ESR is shown.

Figure 4:
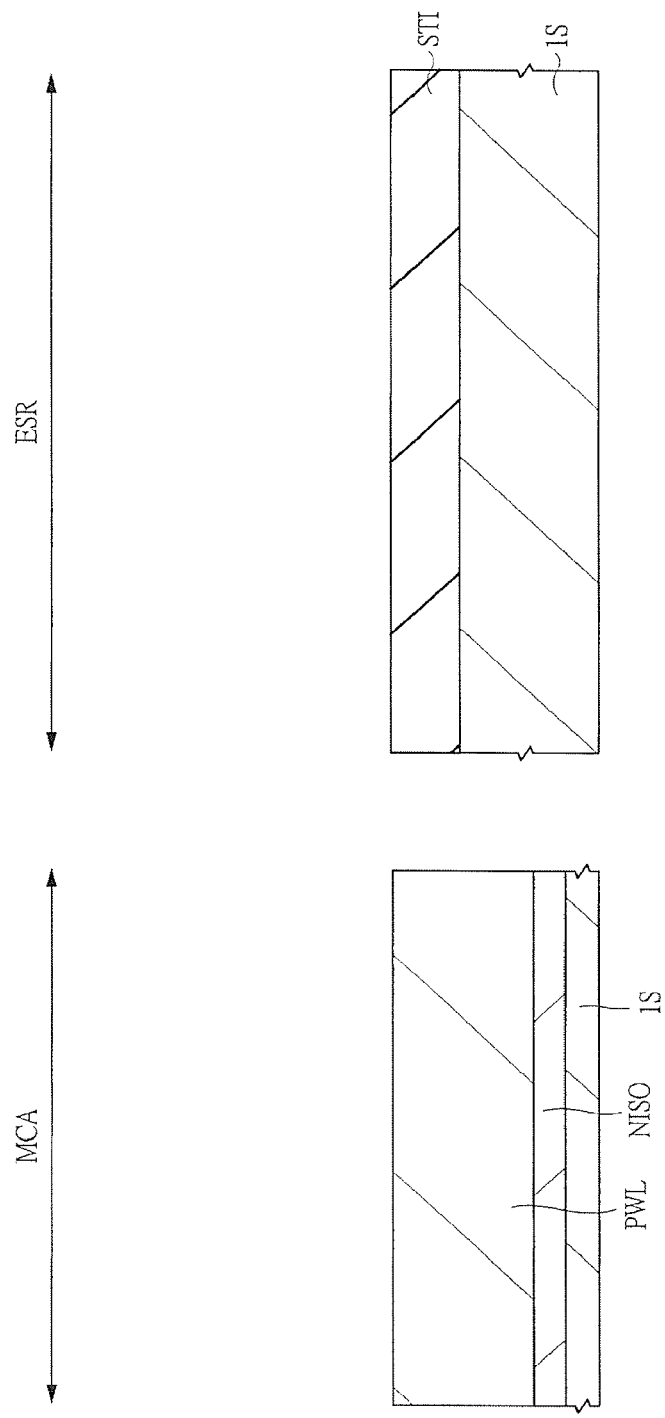
FIG. 4 is a section view showing a manufacturing process of a non-volatile memory semiconductor device in a comparative example.

First, as shown in FIG. 4, the semiconductor substrate 1S including a silicon single crystal into which p-type impurities, such as boron (B), have been introduced is prepared. At this time, the semiconductor substrate 1S is in a state of a semiconductor wafer in substantially the shape of a disc. Then, in the electricity supply region ESR of the semiconductor substrate 1S, the element isolation region STI is formed.

Subsequently, by introducing impurities into the semiconductor substrate 1S of the memory cell array region MCA, the well isolation layer NISO is formed. The well isolation layer NISO is formed by introducing n-type impurities, such as phosphorus and arsenic, into the semiconductor substrate 1S. Then, by introducing impurities into the semiconductor substrate 1S, the p-type well PWL is formed. The p-type well PWL is formed by introducing p-type impurities, such as boron, for example, into the semiconductor substrate 1S by the ion implantation method.

Figure 5:
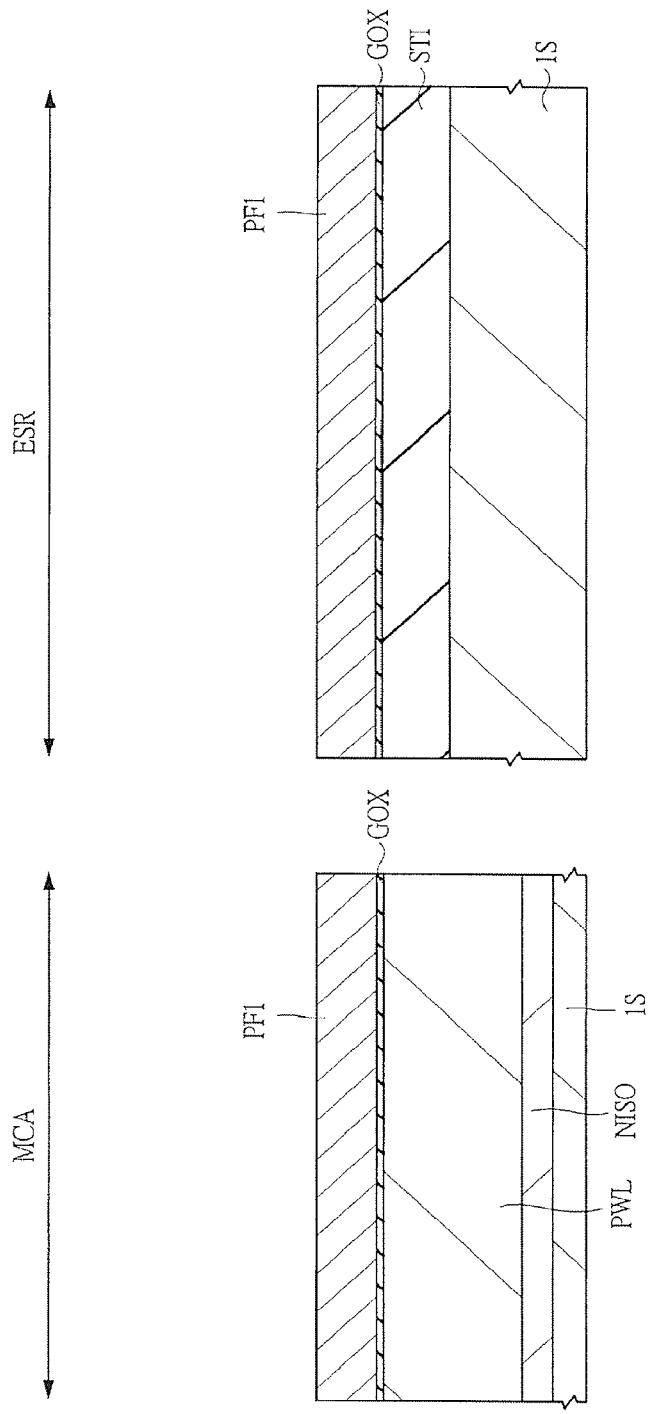
FIG. 5 is a section view showing the manufacturing process of the non-volatile memory semiconductor device, following FIG. 4.

Next, as shown in FIG. 5, the gate insulating film GOX is formed over the semiconductor substrate 1S. The gate insulating film GOX can be formed from, for example, a silicon oxide film using, for example, the thermal oxidation method. Then, over the gate insulating film GOX, the polysilicon film PF1 is formed. The polysilicon film PF1 can be formed using, for example, the CVD method. Then, n-type impurities, such as phosphorus and arsenic, are introduced into the polysilicon film PF1 using the photolithography technique and the ion implantation method.

Figure 6:
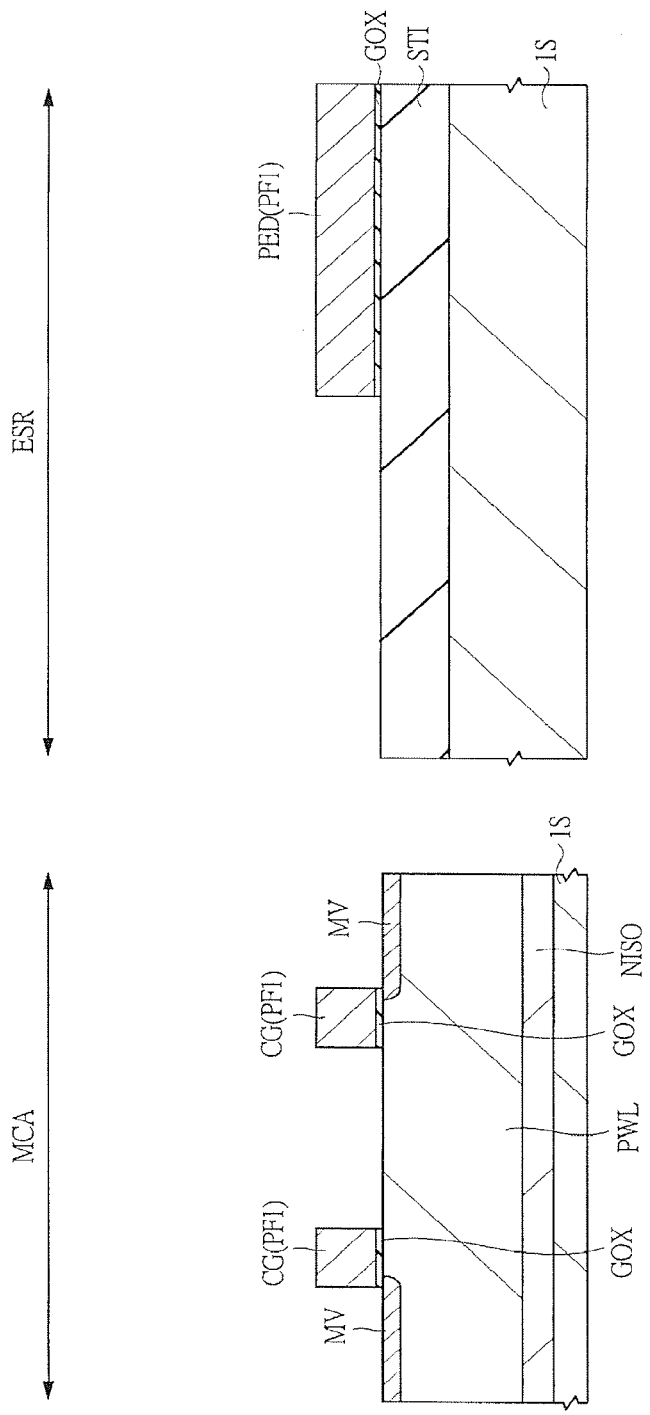
FIG. 6 is a section view showing the manufacturing process of the non-volatile memory semiconductor device, following FIG. 5.

Subsequently, as shown in FIG. 6, the polysilicon film PF1 is processed by etching using a patterned resist film as a mask to form the control gate electrode CG in the memory cell array region MCA and then the pedestal part PED is formed in the electricity supply region ESR. As described above, the control gate electrode CG formed in the memory cell array region MCA and the pedestal part PED formed in the electricity supply region ESR are formed by processing the same polysilicon film PF1. At this time, in the electricity supply region ESR, a step is generated between the region in which the pedestal part PED is formed and the region in which the pedestal part PED is not formed. Then, in the memory cell array region MCA, the n-type semiconductor region MV is formed using the photolithography technique and the ion implantation method.

Figure 7:
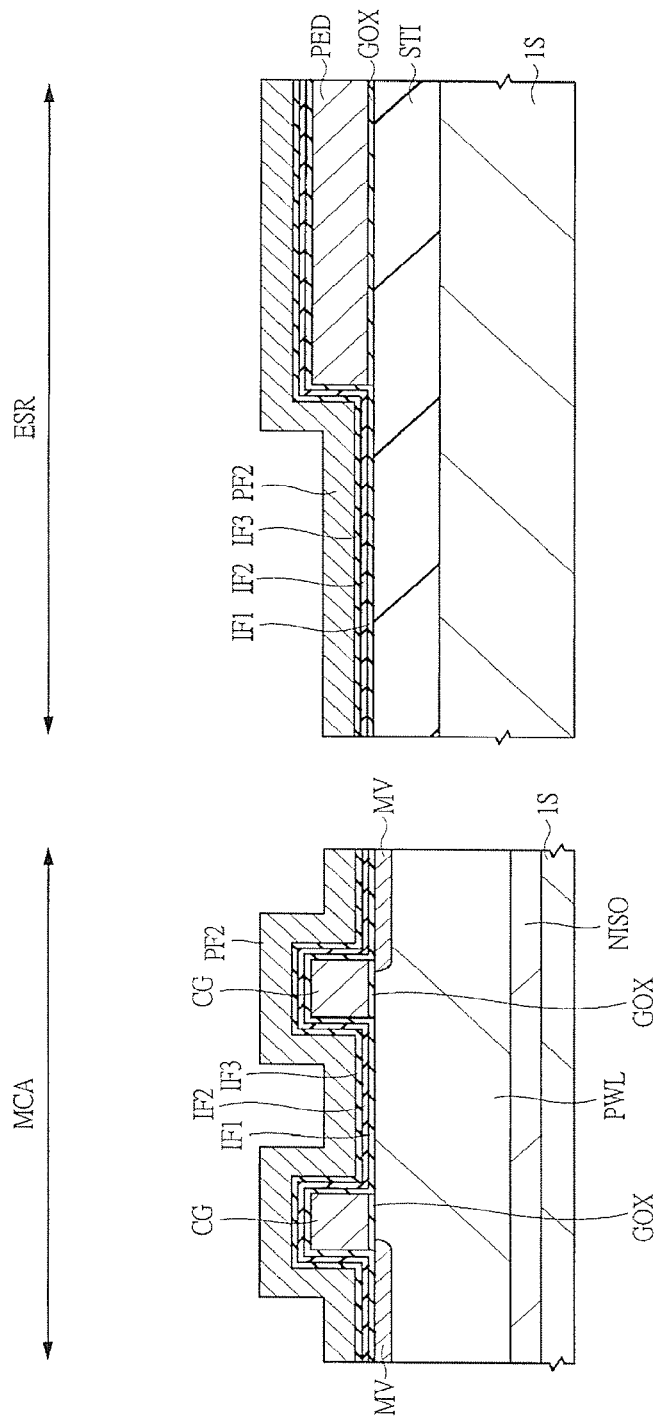
FIG. 7 is a section view showing the manufacturing process of the non-volatile memory semiconductor device, following FIG. 6.

After that, as shown in FIG. 7, over the semiconductor substrate 1S, a laminated film including the silicon oxide film IF1, the silicon nitride film IF2, and a silicon oxide film IF3 is formed and over the laminated film, the polysilicon film PF2 is formed. At this time, in the electricity supply region ESR, the laminated film and the polysilicon film PF2 are formed so that they reflect the step made by the pedestal part PED.

Figure 8:
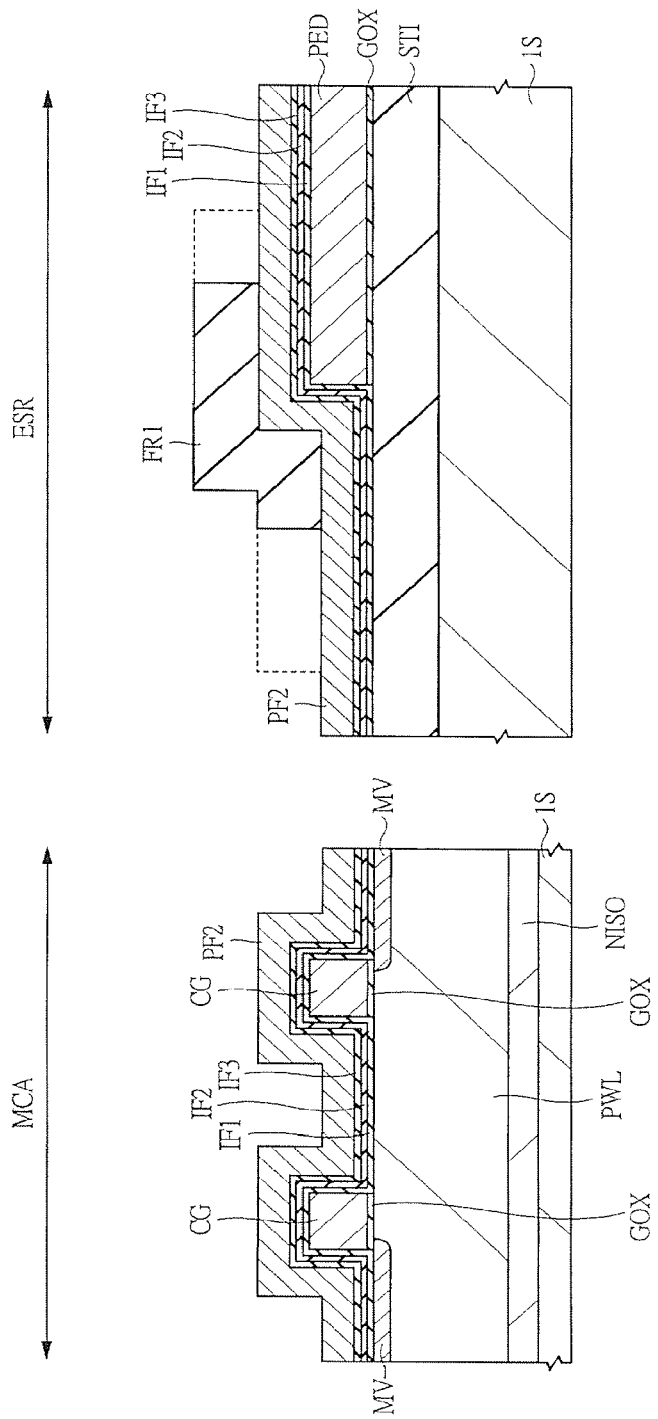
FIG. 8 is a section view showing the manufacturing process of the non-volatile memory semiconductor device, following FIG. 7.

Next, as shown in FIG. 8, after a resist film FR1 is applied over the semiconductor substrate 1S, the resist film FR1 is patterned. At this time, in the electricity supply region ESR, it is designed so that the region where an electricity supply line is formed is covered with the resist film FR1. Here, the electricity supply line is formed so that its one end runs onto the pedestal part PED and the other end is arranged over the semiconductor substrate 1S that serves as a front-end of the pedestal part PED, and therefore, the electricity supply line is formed vertically across the step made by the pedestal part PED as a result. Consequently, the resist film FR1 used to form the electricity supply line is also patterned over the step made by the pedestal part PED. This means that focusing on both the resist films FR1 formed vertically across the step becomes difficult when subjecting the resist film FR1 to exposure processing. That is, the height of the pedestal part PED is the same as that of the control gate electrode CG, that is, comparatively high, and therefore, the height is greater than the focus depth of an image forming optical system for forming exposure light into an image. Because of this, for example, if the resist film FR1 formed over the pedestal part PED is focused on, the resist film FR1 formed over the semiconductor substrate (front-end) is not focused on and conversely, if the resist film FR1 formed over the semiconductor substrate (front-end) is focused on, the resist film formed over the pedestal part PED is not focused on. Consequently, in order to minimize the degree of out-of-focus state, focusing is set so that the focal point of the exposure light is at the middle of the step. However, even if the focal position is adjusted as described above, the resist film FR1 formed over the pedestal part PED and the resist film FR1 formed over the semiconductor substrate 1S are not focused on, and therefore, exposure is performed in an out-of-focus state.

In this case, if the resist film FR1 is subjected to exposure/development processing, as shown in FIG. 8, a phenomenon occurs, in which the resist film FR1 in the region (shown by the dotted line in FIG. 8) to be originally covered with the resist film FR1 is removed, and the resist film FR1 formed across the step made by the pedestal part PED is no longer patterned so as to cover the entire electricity supply line to be formed (shown by the solid line in FIG. 8).

Figure 9:
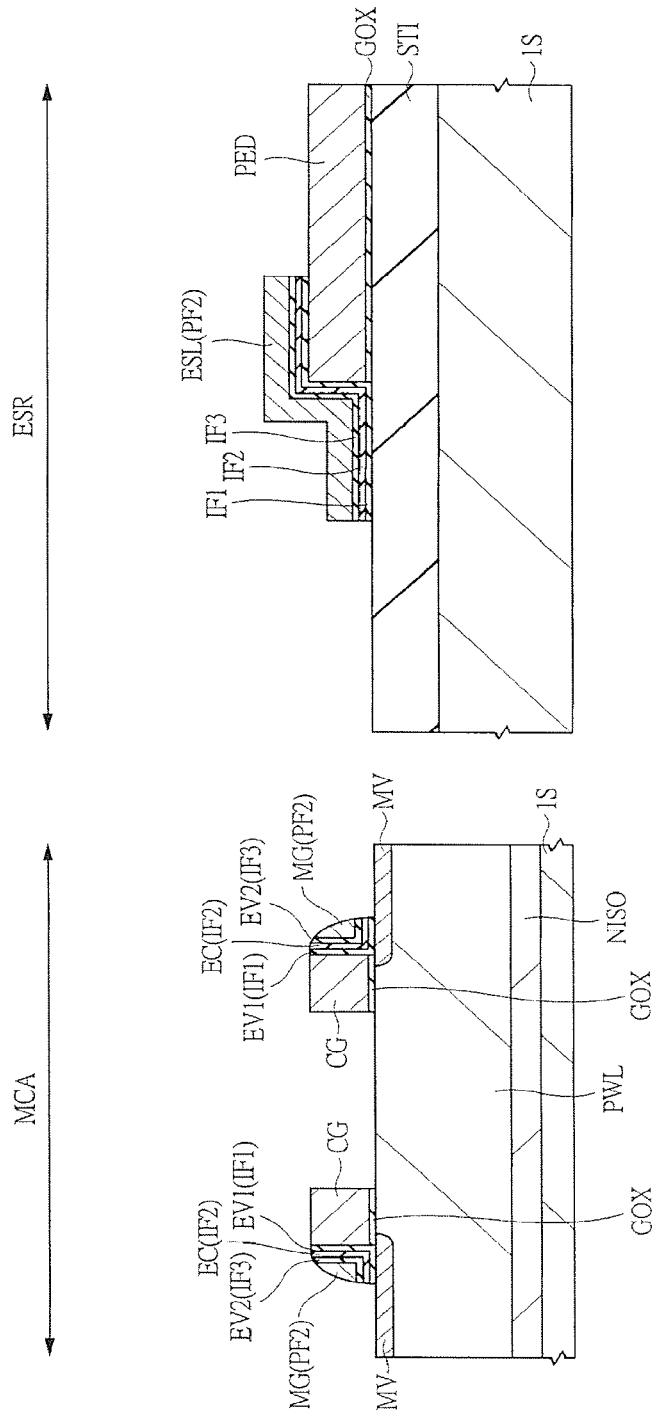
FIG. 9 is a section view showing the manufacturing process of the non-volatile memory semiconductor device, following FIG. 8.

Then, as shown in FIG. 9, the polysilicon film PF2 that is a front-end and the laminated film (silicon oxide film IF1, silicon nitride film IF2, silicon oxide film IF3) are etched using the resist film FR1 thus patterned as a mask. The result is that the electricity supply line ESL including the polysilicon film PF2 is formed in the electricity supply region ESR. However, the electricity supply line ESL to be formed at this time is formed in a state of being contracted compared to the design value as a result that the resist film FR1 is not patterned normally as described above.

On the other hand, in the memory cell array region MCA, it is possible to form the memory gate electrode MG having a sidewall shape on the sidewall of the control gate electrode CG via the laminated film by etching the polysilicon film PF2 and the laminated film (silicon oxide film IF1, silicon nitride film IF2, silicon oxide film IF3). The electricity supply line ESL is formed so that its width is greater than that of the memory gate electrode MG having a sidewall shape (length in the direction of the gate length of the memory gate electrode MG). That is, the electricity supply line ESL is a region that has a width greater than that of the memory gate electrode MG used in the memory cell array region MCA. More specifically, the electricity supply line ESL is formed so that its width is greater than the diameter of the plug PLG1. This also applies to the subsequent embodiments.

Then, at this time, the laminated film includes the silicon oxide film IF1, the silicon nitride film IF2, and the silicon oxide film IF3 and, for example, the silicon oxide film IF1 functions as the potential barrier film EV1 and the silicon nitride film IF2 functions as the charge storage film EC. Further, the silicon oxide film IF3 functions as the potential barrier film EV2. When the polysilicon film PF2 and the laminated film are subjected to anisotropic etching, the memory gate electrode MG is formed on the sidewall on both sides of the control gate electrode CG, however, after that, the memory gate electrode MG formed on the sidewall on one of the sides of the control gate electrode CG is removed using the photolithography technique and the etching technique.

Figure 10:
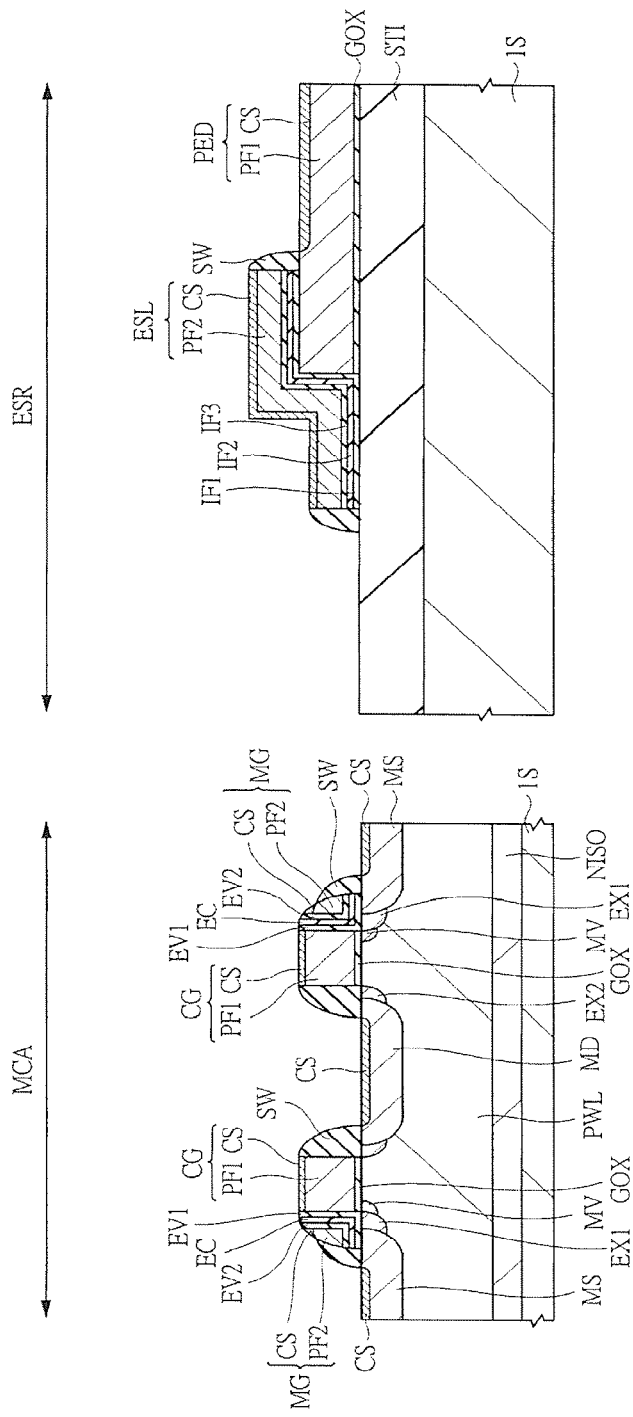
FIG. 10 is a section view showing the manufacturing process of the non-volatile memory semiconductor device, following FIG. 9.

Next, as shown in FIG. 10, in the memory cell array region MCA, the shallow low-concentration impurity diffusion regions EX1, EX2 in alignment with the control gate electrode CG and the memory gate electrode MG are formed using the photolithography technique and the ion implantation method. The shallow low-concentration impurity diffusion regions EX1, EX2 are an n-type semiconductor region into which n-type impurities, such as phosphorus and arsenic, have been introduced.

After that, a silicon oxide film is formed over the semiconductor substrate 1S. The silicon oxide film can be formed using, for example, the CVD method. Then, by subjecting the silicon oxide film to anisotropic etching, the sidewall SW is formed. In the memory cell array region MCA, the sidewall SW is formed on the sidewall of the control gate electrode CG and on the sidewall of the memory gate electrode MG. Similarly, in the electricity supply region ESR, the sidewall SW is formed on the sidewall of both end portions of the electricity supply line ESL.

Subsequently, using the photolithography technique and the ion implantation method, the deep high-concentration impurity diffusion regions MS, MD in alignment with the sidewall SW are formed in the memory cell array region MCA. The deep high-concentration impurity diffusion regions MS, MD are an n-type semiconductor region into which n-type impurities, such as phosphorus and arsenic, have been introduced.

Next, after forming a cobalt film over the semiconductor substrate 1S, by performing heat treatment, the polysilicon films PF1, PF2 constituting the control gate electrode CG and the memory gate electrode MG are caused to react with the cobalt film to form the cobalt silicide film CS in the memory cell array region MCA. Due to this, the control gate electrode CG and the memory gate electrode MG have a laminated structure of the polysilicon films PF1, PF2 and the cobalt silicide film CS, respectively. Similarly, on the surface of the high-concentration impurity diffusion regions MS, MD also, the silicon and cobalt films react and thereby the cobalt silicide film CS is formed.

On the other hand, in the electricity supply region ESR also, the cobalt silicide film CS is formed on the surface of the polysilicon film PF2 constituting the electricity supply line ESL. Due to this, the electricity supply line ESL includes the polysilicon film PF2 and the cobalt silicide film CS as a result.

As described above, it is possible to form a plurality of memory cells in the memory cell array region MCA of the semiconductor substrate 1S and form the electricity supply line ESL in the electricity supply region ESR.

Figure 11:
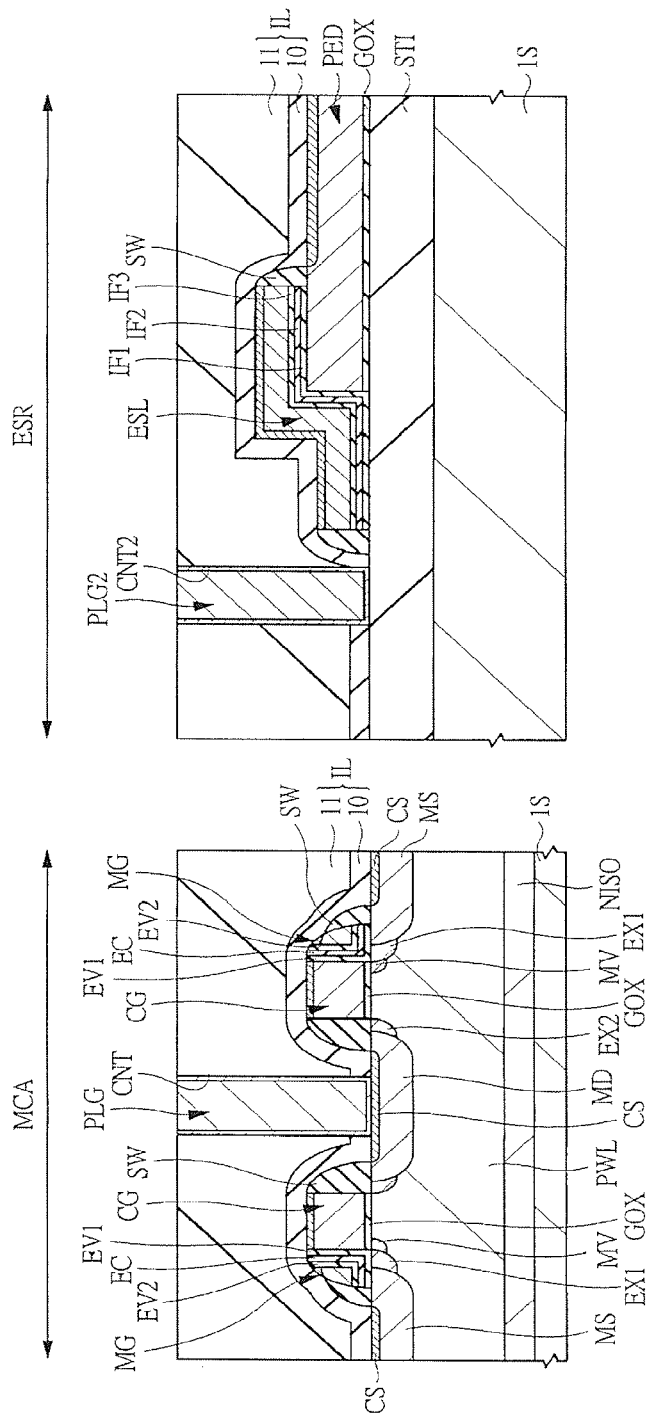
FIG. 11 is a section view showing the manufacturing process of the non-volatile memory semiconductor device, following FIG. 10.

Next, the wiring process will be described with reference to FIG. 11. As shown in FIG. 11, the interlayer insulating film IL is formed over the main surface of the semiconductor substrate 1S. The interlayer insulating film IL is formed from, for example, the silicon nitride film 10 and the silicon oxide film 11. After that, the surface of the interlayer insulating film IL is planarized using, for example, the CMP (Chemical Mechanical Polishing) method.

Subsequently, a contact hole is formed in the interlayer insulating film IL using the photolithography technique and the etching technique. For example, in the memory cell array region MCA, the contact hole CNT is formed and the contact hole CNT2 is formed in the electricity supply region ESR.

After that, a titanium/titanium nitride film is formed over the interlayer insulating film IL including the bottoms and the inner walls of the contact holes CNT, CNT2. The titanium/titanium nitride film includes a laminated film of a titanium film and a titanium nitride film and can be formed using, for example, the sputtering method. Then, a tungsten film is formed over the entire surface of the main surface so as to be embedded in the contact holes CNT, CNT2. The tungsten film can be formed using, for example, the CVD method. Then, the plug PLG and the plug PLG2 can be formed by removing the unnecessary titanium/titanium nitride film and tungsten film formed over the interlayer insulating film IL by, for example, the CMP method.

Here, paying attention to the electricity supply region ESR, a normal structure is such that the plug PLG2 is formed so as to be connected with the electricity supply line ESL, however, as a result of that the electricity supply line ESL is formed contracted as described above, there is a case where the electricity supply line ESL and the plug PLG2 are not electrically connected. In this case, if the electricity supply line ESL and the plug PLG2 are brought into a non-conductive state, it is no longer possible to supply a voltage to the memory gate electrode MG from the outside via the electricity supply line ESL. That is, it is no longer possible to supply a voltage to the memory gate electrode MG, and therefore, it is no longer possible to write or erase data to or from a memory cell and there arises a problem that the reliability of the non-volatile memory semiconductor device is degraded.

As described above, in the comparative example, the electricity supply line ESL is formed across the step between the pedestal part PED and the semiconductor substrate 1S, and therefore, the resist film FR1 is patterned inevitably across the step. As a result, it becomes difficult to focus the exposure light on both the resist films FR1 formed over and under the step and a defect in the shape of the resist film FR1 occurs.

Consequently, the polysilicon film PF2 is patterned using the resist film FR1 defective in shape, and therefore, the electricity supply line ESL contracts, which is formed by processing the polysilicon film PF2. As a result, the electricity supply line ESL and the plug PLG2 are brought into a non-conductive state and it is no longer possible to supply a voltage to the memory gate electrode MG via the electricity supply line ESL.

An object of the first embodiment is, therefore, to improve the reliability of a non-volatile memory semiconductor device by providing a technique capable of supplying electricity to a memory gate electrode of a split gate transistor without fail. The technical concept of the first embodiment that realizes the above-mentioned object will be described below.

Figure 12:
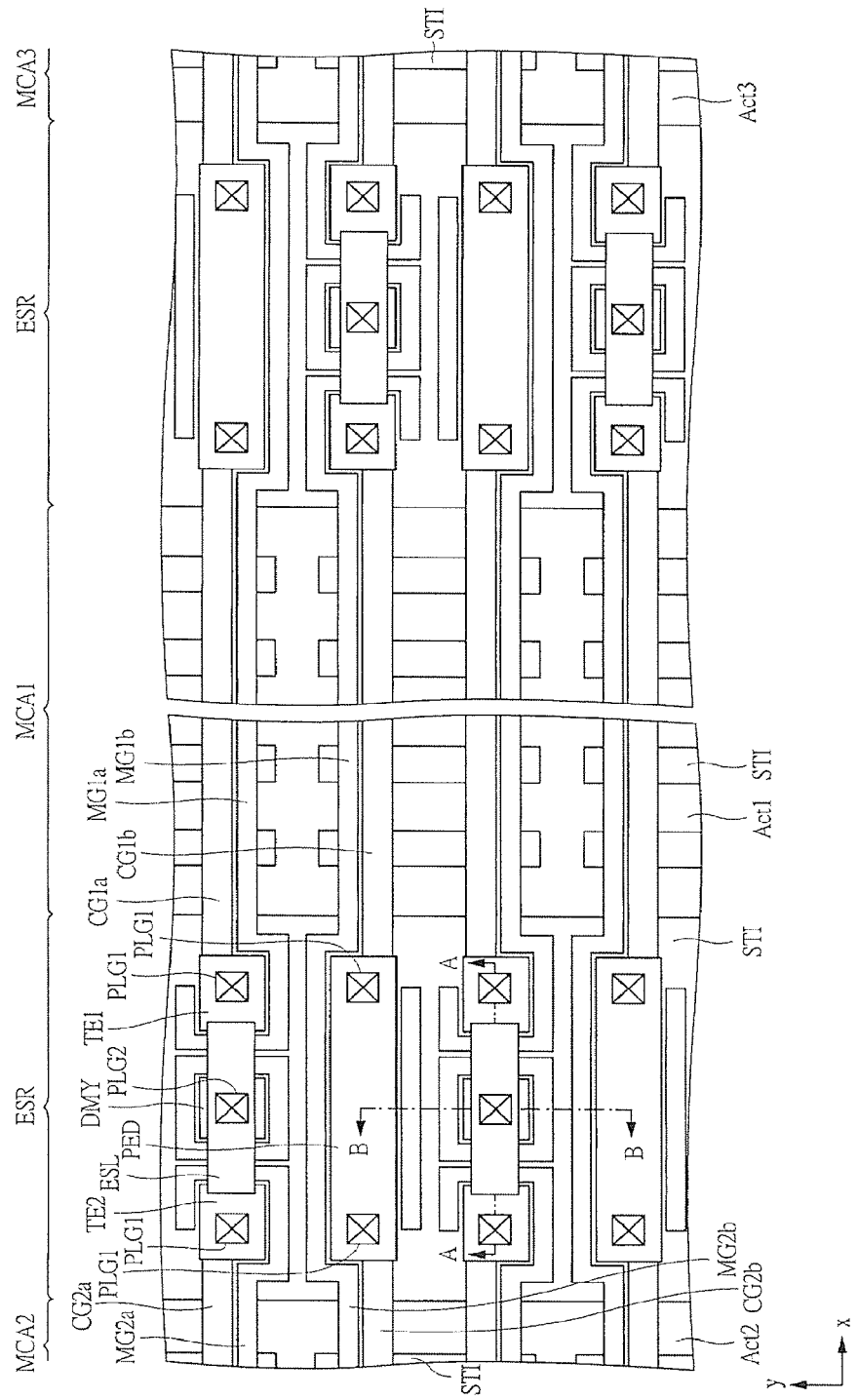
FIG. 12 is a diagram showing a layout configuration of a non-volatile memory semiconductor device in a first embodiment of the present invention.

FIG. 12 is a diagram showing a layout configuration of the non-volatile memory semiconductor device in the first embodiment. As shown in FIG. 12, in the non-volatile memory semiconductor device in the first embodiment, the memory cell array regions MCA1, MCA2 and MCA3 are arranged side by side along an x-axis direction (first direction) and the electricity supply region ESR is arranged so as to be sandwiched between the memory cell array region MCA1 and the memory cell array region MCA2 or between the memory cell array region MCA1 and the memory cell array region MCA3.

The memory cell array regions MCA1, MCA2 and MCA3 are regions in which a plurality of memory cells is formed in an array and the electricity supply region ESR is a region used to supply a voltage to the memory cell array regions MCA1, MCA2 and MCA3. That is, because it is necessary to apply a predetermined voltage to the memory cell at the time of write operation, erase operation, and read operation, the electricity supply region ESR is provided in order to supply a predetermined voltage to the memory cell when performing these operations.

The configuration of the memory cell array regions MCA1, MCA2 and MCA3 and the electricity supply region ESR in the first embodiment described above will be described. First, the memory cell array regions MCA1, MCA2 and MCA3 have a similar configuration. Specifically, in the memory cell array region MCA1, the active region Act1 defined by the element isolation region STI is formed and a plurality of memory cells is formed in the active region Act1. Similarly, in the memory cell array region MCA2 also, the active region Act2 defined by the element isolation region STI is formed and a plurality of memory cells is formed in the active region Act2. Further, in the memory cell array region MCA3 also, an active region Act3 defined by the element isolation region STI is formed and a plurality of memory cells is formed in the active region Act3. On the other hand, the element isolation region STI is formed over the entire surface across the interior of the semiconductor substrate in the electricity supply region ESR.

Subsequently, a layout configuration will be described while paying attention to the memory cell array regions MCA1, MCA2 and the electricity supply region sandwiched between the memory cell array regions MCA1, MCA2. As shown in FIG. 12, a control gate electrode CG1a extending along the x-axis direction from the memory cell array region MCA1 to the electricity supply region ESR is formed. Further, the control gate electrode CG1a extending in the x-axis direction within the memory cell array region MCA1 is connected to a terminal end TE1 in the electricity supply region ESR. That is, the control gate electrode CG1a terminates within the electricity supply region ESR as a result. The width of the terminal end TE1 in the y-axis direction existing in the electricity supply region ESR is greater than that of the control gate electrode CG1a. To the terminal end TE1, the plug PLG1 is electrically connected and a predetermined voltage is supplied to the control gate electrode CG1a via the plug PLG1.

Further, along the x-axis direction, a control gate electrode CG2a extending from the memory cell array region MCA2 to the electricity supply region ESR is formed. Further, the control gate electrode CG2a extending in the x-axis direction within the memory cell array region MCA2 is electrically connected to a terminal end TE2 within the electricity supply region ESR. The width of the terminal end TE2 in the y-axis direction existing in the electricity supply region ESR is greater than that of the control gate electrode CG2a. To the terminal end TE2, the plug PLG1 is electrically connected and a predetermined voltage is supplied to the control gate electrode CG2a via the plug PLG1.

At this time, the control gate electrode CG1a and the control gate electrode CG2a are arranged in a straight line. On the sidewall of the control gate electrode CG1a arranged in a straight line, a memory gate electrode MG1a having a sidewall shape and extending in the x-axis direction is formed via an insulating film. Similarly, on the sidewall of the control gate electrode CG2a, a memory gate electrode MG2a having a sidewall shape and extending in the x-axis direction is formed via an insulating film. The memory gate electrode MG1a formed on the sidewall of the control gate electrode CG1a is formed also on the sidewall of the terminal end TE1 so as to surround the periphery of the terminal end TE1. Similarly, the memory gate electrode MG2a formed on the sidewall of the control gate electrode CG2a is formed also on the sidewall of the terminal end TE2 so as to surround the periphery of the terminal end TE2.

Next, in the memory cell array region MCA1, a control gate electrode CG1b extends in the x-axis direction adjoining and in parallel with the control gate electrode CG1a extending in the x-axis direction. Further, the pedestal part PED is arranged, which extends along the x-axis direction within the electricity supply region ESR and is electrically connected with the control gate electrode CG1b. Further, a control gate electrode CG2b is arranged, which extends along the x-axis direction from the electricity supply region ESR to the memory cell array region MCA2 and is electrically connected with the pedestal part PED within the electricity supply region ESR. At this time, the control gate electrode CG1b, the pedestal part PED, and the control gate electrode CG2b are arranged in a straight line. On the respective sidewalls of the control gate electrode CG1, the pedestal part PED, and the control gate electrode CG2b arranged in a straight line, a memory gate electrode MG1b and a memory gate electrode MG2b having a sidewall shape extending in the x-axis direction are formed via an insulating film. To the pedestal part PED, the plug PLG1 is electrically connected and thereby a predetermined voltage is supplied to the control gate electrode CG1b and the control gate electrode CG2b via the plug PLG1.

In the memory cell array region MCA1, the control gate electrode CG1a and the control gate electrode CG1b are alternately arranged and thereby a plurality of memory cells is formed in an array as a result. Here, there is no difference in the configuration between the control gate electrode CG1a and the control gate electrode CG1b within the memory cell array region MCA1, however, the configurations differ from each other within the electricity supply region ESR formed adjoining the memory cell array region MCA1. That is, while the control gate electrode CG1a is configured so as to be connected to the terminal end TE1 in the electricity supply region ESR, the control gate electrode CG1b is configured so as to be connected to the pedestal part PED in the electricity supply region ESR. Because of this, in the first embodiment, the control gate electrodes arranged in parallel with each other within the memory cell array region MCA1 are discriminated into the control gate electrode CG1a and the control gate electrode CG1b.

As shown in FIG. 12, however, in the electricity supply region ESR arranged to the left side of the memory cell array region MCA1, the control gate electrode CG1a is configured so as to be connected to the terminal end TE1 and the control gate electrode CG1b is configured so as to be connected to the pedestal part PED. In contrast to this, in the electricity supply region ESR arranged to the right side of the memory cell array region MCA1, the control gate electrode CG1a is configured in an opposite manner so as to be connected to the pedestal part and the control gate electrode CG1b is configured so as to be connected to the terminal end.

Next, the characteristic point of the first embodiment will be described. As shown in FIG. 12, in the electricity supply region ESR, a dummy part DMY is formed between the terminal end TE1 and the terminal end TE2. The dummy part DMY is formed so that its height is substantially the same as that of the terminal end TE1 and the terminal end TE2. Then, the terminal end TE1, the dummy part DMY, and the terminal end TE2 are arranged in a straight line and the electricity supply line ESL is formed from over the terminal end TE1 to over the terminal end TE2 via over the dummy part DMY. Consequently, the electricity supply line ESL is electrically connected with the memory gate electrode MG1a formed on the sidewall of the terminal end TE1 and electrically connected with the memory gate electrode MG2a formed on the sidewall of the terminal end TE2. That is, the memory gate electrode MG1a and the memory gate electrode MG2a are electrically connected with each other via the electricity supply line ESL. Further, the electricity supply line ESL is formed over the dummy part DMY and over the dummy part DMY, the plug PLG2 is electrically connected to the electricity supply line ESL. Due to this, a voltage is supplied from the plug PLG2 to the electricity supply line ESL and the voltage supplied to the electricity supply line ESL is supplied to the memory gate electrode MG1a and the memory gate electrode MG2a electrically connected with the electricity supply line ESL. That is, it is possible to supply a predetermined voltage to the memory gate electrode MG1a and the memory gate electrode MG2a via the electricity supply line ESL.

The characteristic of the first embodiment lies in the layout configuration of the electricity supply line ESL. As shown in FIG. 12, in the first embodiment, one end of the electricity supply line ESL is arranged over the terminal end TE1, the other end of the electricity supply line ESL is arranged over the terminal end TE2, and further, the central portion of the electricity supply line ESL is arranged over the dummy part DMY. Due to this, it is possible to form most of the electricity supply line ESL so as to have substantially the same height. That is, the terminal end TE1, the terminal end TE2, and the dummy part DMY have substantially the same height, and therefore, most of the electricity supply line ESL arranged from over the terminal end TE1 to over the terminal end TE2 via over the dummy part DMY is formed so as to have the same height. By making most of the electricity supply line ESL have the same height as described above, the height of the resist film used when patterning the electricity supply line ESL becomes constant. As a result, the out-of-focus state when performing exposure processing of the resist film is eliminated and it is possible to suppress the defect in the shape of the resist film. Consequently, it is possible to form a resist film that reflects the shape of the normal electricity supply line ESL and to perform the normal patterning of the electricity supply line ESL. Because of this, it is possible to ensure the electrical connection between the electricity supply line ESL and the plug PLG2 and to supply electricity to the memory gate electrodes MG1a, MG2a of split gate transistor without fail. That is, according to the first embodiment, it is possible to improve the reliability of a non-volatile memory semiconductor device.

Figure 13:
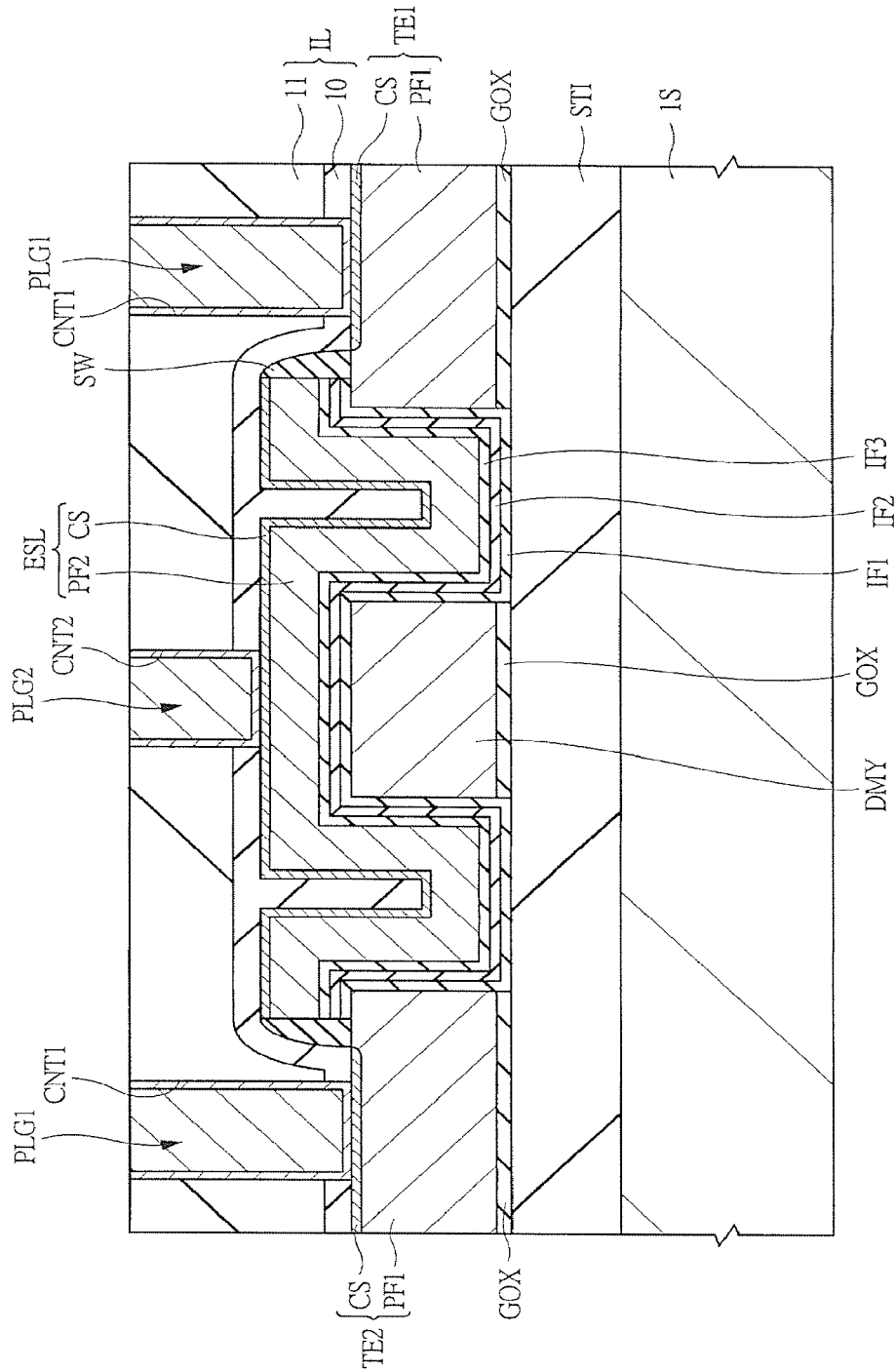
FIG. 13 is a section view cut by A-A line in FIG. 12.

Further, a detailed configuration of the electricity supply line ESL will be described. FIG. 13 is a section view cut along A-A line in FIG. 12. As shown in FIG. 13, over the semiconductor substrate 1S, the element isolation region STI is formed and over the element isolation region STI, the terminal end TE1, the terminal end TE2, and the dummy part DMY are formed via the gate insulting film GOX. At this time, the dummy part DMY is located between the terminal end TE1 and the terminal end TE2. That is, the dummy part DMY is a region that is not electrically connected with the control gate electrode CG1a or the control gate electrode CG2a. The terminal end TE1, the terminal end TE2, and the dummy part DMY are formed from the same polysilicon film PF1 and the dummy part DMY is provided between the terminal end TE1 and the terminal end TE2. The terminal end TE1, the terminal end TE2, and the dummy part DMY are formed so as to have substantially the same height and the polysilicon film PF1 that constitutes the terminal end TE1, the terminal end TE2, and the dummy part DMY is the same film as that constituting the control gate electrode CG1a and the control gate electrode CG2a shown in FIG. 12. On the surface of the polysilicon film PF1 constituting the terminal end TE1 and the terminal end TE2, the cobalt silicide film CS is formed.

As shown in FIG. 13, the electricity supply line ESL is formed so as to extend from the terminal end TE1 to the terminal end TE2 via the dummy part DMY. Specifically, a laminated film is formed so as to cover the side surface and the top surface of the dummy part DMY from over the element isolation region STI after passing part of the top surface and the side surface of the terminal end TE1, and further extend from over the element isolation region STI to the side surface and part of the top surface of the terminal end TE2, and the electricity supply line ESL is formed over the laminated film. The laminated film includes the silicon oxide film IF1, the silicon nitride film IF2, and the silicon oxide film IF3. On the other hand, the electricity supply line ESL is formed from the polysilicon film PF2 and the cobalt silicide film CS formed on the surface of the polysilicon film PF2. The polysilicon film PF2 that constitutes the electricity supply line ESL is the same film as that constituting the memory gate electrode MG1a and the memory gate electrode MG2a shown in FIG. 12.

As described above, in the first embodiment, one end of the electricity supply line ESL is arranged over the terminal end TE1 and the other end of the electricity supply line ESL is arranged over the terminal end TE2. Further, the central portion of the electricity supply line ESL is arranged over the dummy part DMY. Consequently, most of the electricity supply line ESL is arranged over the terminal end TE1, the terminal end TE2, and the dummy part DMY, and therefore, most of the electricity supply line ESL maintains the same height.

At this time, as shown in FIG. 13, in the region between the terminal end TE1 and the dummy part DMY and in the region between the terminal end TE2 and the dummy part DMY, the electricity supply line ESL is arranged over the element isolation region STI as a result. That is, in the first embodiment, most of the region of the electricity supply line ESL is arranged over the terminal end TE1, the terminal end TE2, and the dummy part DMY having the same height, however, part of the electricity supply line ESL is arranged over the element isolation region STI as a result. That is, there is generated a step between part of the electricity supply line ESL arranged over the element isolation region STI and most of the electricity supply line ESL arranged over the terminal end TE1, the terminal end TE2, and the dummy part DMY. However, the part of the electricity supply line ESL arranged over the element isolation region STI is a very narrow region, and therefore, there arises no problem. The part of the electricity supply line ESL in which a step is generated is a very narrow region, and therefore, it is possible to form a resist film to be formed generated the polysilicon film PF2 without reflecting the step almost completely when patterning the electricity supply line ESL. In other words, the shape of the resist film used to form the electricity supply line ESL has a shape that reflects the flatness of the polysilicon film PF2 arranged over the terminal end TE1, the terminal end TE2, and the dummy part DMY. Because of this, it is possible to suppress the out-of-focus state when performing exposure processing of the resist film.

The important point in the first embodiment is that the configuration is designed so that the heights of both end portions of the electricity supply line ESL are the same. Due to this, it is possible to suppress the occurrence of a step between both end portions of the electricity supply line ESL. As already described in the comparative example, if a step is generated between both end portions of the electricity supply line ESL, the resist film used when patterning the electricity supply line ESL comes to have a shape that reflects the step. Because of this, the patterning of the resist film is not performed normally and both end portions of the electricity supply line ESL contract. That is, the contraction of the electricity supply line ESL tends to become actual as a problem when a step is generated between both end portions of the electricity supply line ESL, however, even if a step is generated at a part other than both end portions of the electricity supply line ESL, the contraction of the electricity supply line ESL hardly takes place and it does not become actual as a serious problem. Because of this, in the first embodiment, the heights of both end portions of the electricity supply line ESL are made the same. As a result, it is possible to suppress the out-of-focus state of exposure light when performing exposure processing at both end portions of the electricity supply line ESL, and therefore, the resist film is formed normally. This means that it is possible to normally pattern the electricity supply line ESL without causing the contraction of the electricity supply line ESL. Further, in the first embodiment, the heights of both end portions of the electricity supply line ESL are made the same and, at the same time, the dummy part DMY having the same height as that of both end portions is formed also at the central portion of the electricity supply line ESL. Due to this, it is possible to cause most of the electricity supply line ESL to have the same height, and therefore, it is possible to make constant the height of the resist film used when patterning the electricity supply line ESL. As a result, the out-of-focus state when performing exposure processing of the resist film is eliminated and the defect in the shape of the resist film can be suppressed. Consequently, it is possible to form a resist film that reflects the shape of the normal electricity supply line ESL and to normally pattern the electricity supply line ESL.

Next, as shown in FIG. 13, on the sidewall on both sides of the electricity supply line ESL, the sidewall SW is formed and the interlayer insulating film IL is formed so as to cover the electricity supply line ESL, the terminal end TE1, and the terminal end TE2. The interlayer insulating film IL is formed from, for example, the silicon nitride film 10 and the silicon oxide film 11. Then, in the interlayer insulating film IL, a contact hole CNT1 that reaches the terminal end TE1 and the terminal end TE2 is formed and the plug PLG1 is formed by embedding a conductive material including a titanium/titanium nitride film and a tungsten film in the contact hole CNT1. To the plug PLG1, a wire, not shown schematically, is connected, and thereby, a voltage is supplied to the terminal end TE1 and the terminal end TE2 via the plug PLG1. The terminal end TE1 is electrically connected with the control gate electrode CG1a shown in FIG. 12 and the terminal end TE2 is electrically connected with the control gate electrode CG2a shown in FIG. 12, and therefore, a voltage is supplied from the plug PLG1 to the control gate electrode CG1a via the terminal end TE1 and a voltage is supplied from the plug PLG1 to the control gate electrode CG2a via the terminal end TE2 as a result.

Further, as shown in FIG. 13, in the interlayer insulating film IL, the contact hole CNT2 that reaches the electricity supply line ESL is formed and the plug PLG2 is formed by embedding a conductive material including a titanium/titanium nitride film and a tungsten film in the contact hole CNT2. To the plug PLG2, a wire, not shown schematically, is connected, and thereby, a voltage is supplied to the electricity supply line ESL via the plug PLG2 The electricity supply line ESL is electrically connected with the memory gate electrode MG1a and the memory gate electrode MG2a shown in FIG. 12, and therefore, a voltage is supplied from the plug PLG2 to the memory gate electrode MG1a and the memory gate electrode MG2a via the electricity supply line ESL as a result.

In particular, in the first embodiment, the plug PLG is configured so as to be connected to the central portion of the electricity supply line ESL. In other words, it can be said that the plug PLG2 is formed over the dummy part DMY arranged under the central portion of the electricity supply line ESL. Due to this, it is possible to electrically connect the electricity supply line ESL and the plug PLG2 without fail. For example, if a configuration is designed so that the plug PLG2 and the electricity supply line ESL are connected at the end portion of the electricity supply line ESL, the probability becomes high that the electricity supply line ESL and the plug PLG2 are brought into a non-conductive state when the plug PLG2 shifts in position in the longitudinal direction of the electricity supply line ESL. In contrast to this, if a configuration is designed so that the plug PLG2 is connected at the central portion of the electricity supply line ESL, the conduction state of the electricity supply line ESL and the plug PLG2 can be maintained even if the plug PLG2 shifts in the longitudinal direction of the electricity supply line ESL. That is, by forming the plug PLG2 over the dummy part DMY, the central portion of the electricity supply line ESL, it is possible to ensure a margin for the positional shift of the plug PLG2.

Figure 14:
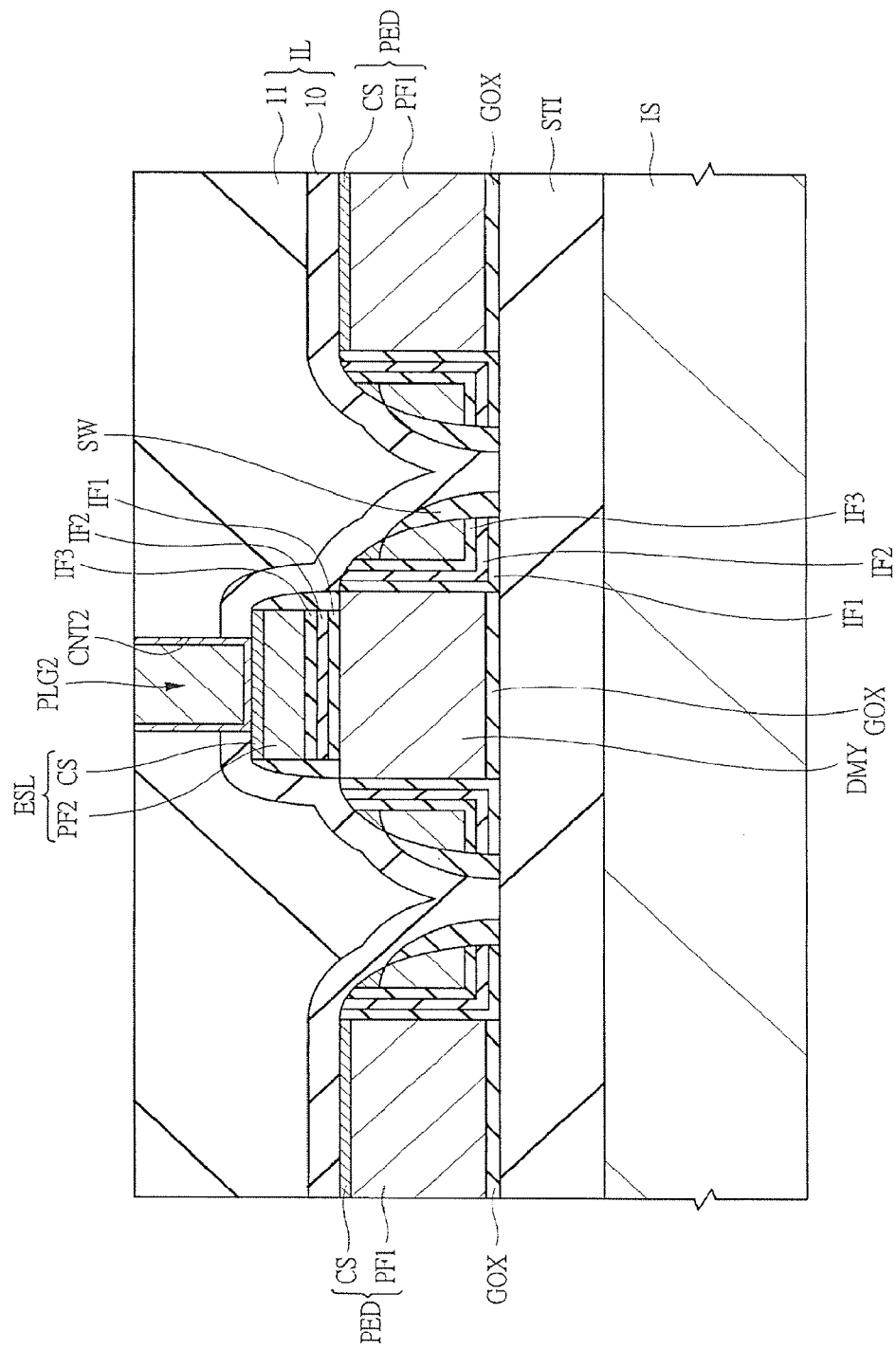
FIG. 14 is a section view cut by B-B line in FIG. 12.

Subsequently, FIG. 14 is a section view cut along B-B line in FIG. 12. As shown in FIG. 14, over the semiconductor substrate 1S, the element isolation region STI is formed and over the element isolation region STI, the pedestal part PED and the dummy part DMY are formed via the gate insulating film GOX. The dummy part DMY is provided between the pedestal parts PED on both sides shown in FIG. 14. The pedestal part PED and the dummy part DMY are formed by processing the same polysilicon film PF1. Then, the pedestal part PED includes the polysilicon film PF1 and the cobalt silicide film CS formed over the polysilicon film PF1, and the dummy part DMY includes the polysilicon film PF1. The polysilicon film PF1 that constitutes the pedestal part PED and the dummy part DMY is the same film as that constituting the control gate electrode CG1b and the control gate electrode CG2b shown in FIG. 12.

On the sidewall of the pedestal part PED and the sidewall of the dummy part DMY, the polysilicon film PF2 is formed via a laminated film. At this time, the laminated film includes the silicon oxide film IF1, the silicon nitride film IF2, and the silicon oxide film IF3. Then, over the dummy part DMY, the electricity supply line ESL is arranged via the laminated film described above. The electricity supply line ESL is formed from the polysilicon film PF2 and the cobalt silicide film CS formed over the surface of the polysilicon film PF2.

That is, the dummy part DMY is a region that is not electrically connected with the semiconductor substrate 1S, the control gate electrode CG1b, the control gate electrode CG2b, the memory gate electrode MG1a, or the memory gate electrode MG2a, respectively, and brought into a floating state.

Over the semiconductor substrate 1S including over the pedestal part PED and over the electricity supply line ESL, the interlayer insulating film IL is formed. The interlayer insulating film IL is formed from the silicon nitride film 10 and the silicon oxide film 11. Then, the contact hole CNT2 that penetrates through the interlayer insulating film IL and reaches the electricity supply line ESL is formed and in the contact hole CNT2, a conductive material including a titanium/titanium nitride film and a tungsten film is embedded and thereby the plug PLG2 is formed. To the plug PLG2, a wire, not shown schematically, is connected, and thereby, a voltage is supplied to the electricity supply line ESL via the plug PLG2. The electricity supply line ESL is electrically connected with the memory gate electrode MG1a and the memory gate electrode MG2a shown in FIG. 12, and therefore, a voltage is supplied to the memory gate electrode MG1a and the memory gate electrode MG2a having a sidewall shape from the plug PLG2 via the electricity supply line ESL as a result.

The non-volatile memory semiconductor device in the first embodiment is configured as described above and its characteristic will be described as follows. That is, as shown in FIG. 12 and FIG. 13, in the first embodiment, one end of the electricity supply line ESL is arranged over the terminal end TE1 and the other end of the electricity supply line ESL is arranged over the terminal end TE2, and further, the central portion of the electricity supply line ESL is arranged over the dummy part DMY. Due to this, most of the electricity supply line ESL is formed so as to have the same height. This point is a remarkable characteristic of the first embodiment.

By making most of the electricity supply line ESL have the same height, the height of the resist film used when patterning the electricity supply line ESL becomes constant. As a result, the out-of-focus state when performing exposure processing of the resist film is eliminated and it is possible to suppress the defect in the shape of the resist film. Consequently, it is possible to form a resist film that reflects the shape of the normal electricity supply line ESL and to perform the normal patterning of the electricity supply line ESL. Because of this, it is possible to ensure the electrical connection between the electricity supply line ESL and the plug PLG2 and to supply electricity to the memory gate electrodes MG1a, MG2a of split gate transistor without fail.

Further, in the first embodiment, by adopting the layout configuration shown in FIG. 12, it is possible to obtain such a remarkable effect as shown below. As shown in FIG. 12, the memory gate electrode MG1a formed in the memory cell array region MCA1 and the memory gate electrode MG2a formed in the memory cell array region MCA2 are electrically connected via the electricity supply line ESL. By repeating such a configuration, other memory gate electrodes arranged in a straight line with the memory gate electrode MG1a and the memory gate electrode MG2a are also connected via the electricity supply line. That is, in FIG. 12, a part is shown, at which the memory gate electrode MG1a and the memory gate electrode MG2a are connected via the electricity supply line ESL, and for example, other memory gate electrodes arranged in a straight line with the memory gate electrode MG1a are also electrically connected via other electricity supply lines as a result. Because of this, in the layout configuration shown in FIG. 12, the memory gate electrodes arranged in a straight line are connected with electricity supply lines at a plurality of parts and therefore are electrically connected to one another as a result. Consequently, for example, even if one of the electricity supply lines that connect the memory gate electrodes arranged in a straight line and the plug are brought into a non-conductive state, it is possible to supply a voltage to all of the memory gate electrodes arranged in a straight line if at least one of the electricity supply lines is in conduction with the plug. This means that a tolerance margin for the defect of a plug that is connected with the electricity supply line is extended. As described above, according to the layout configuration shown in FIG. 12, it is possible to obtain the remarkable effect that the reliability of a non-volatile memory semiconductor device can be improved.

Next, a method for manufacturing the non-volatile memory semiconductor device in the first embodiment will be described with reference to the drawings. FIG. 15 to FIG. 22 are diagrams for illustrating a manufacturing process of the electricity supply line ESL in the first embodiment and the electricity supply line ESL is formed by making use of the process for forming a memory cell to be formed in the memory cell array region. In FIG. 15 to FIG. 22, the memory cell array region MCA is shown in the left-hand side region and the electricity supply region ESR is shown in the right-hand side region.

Figure 15:
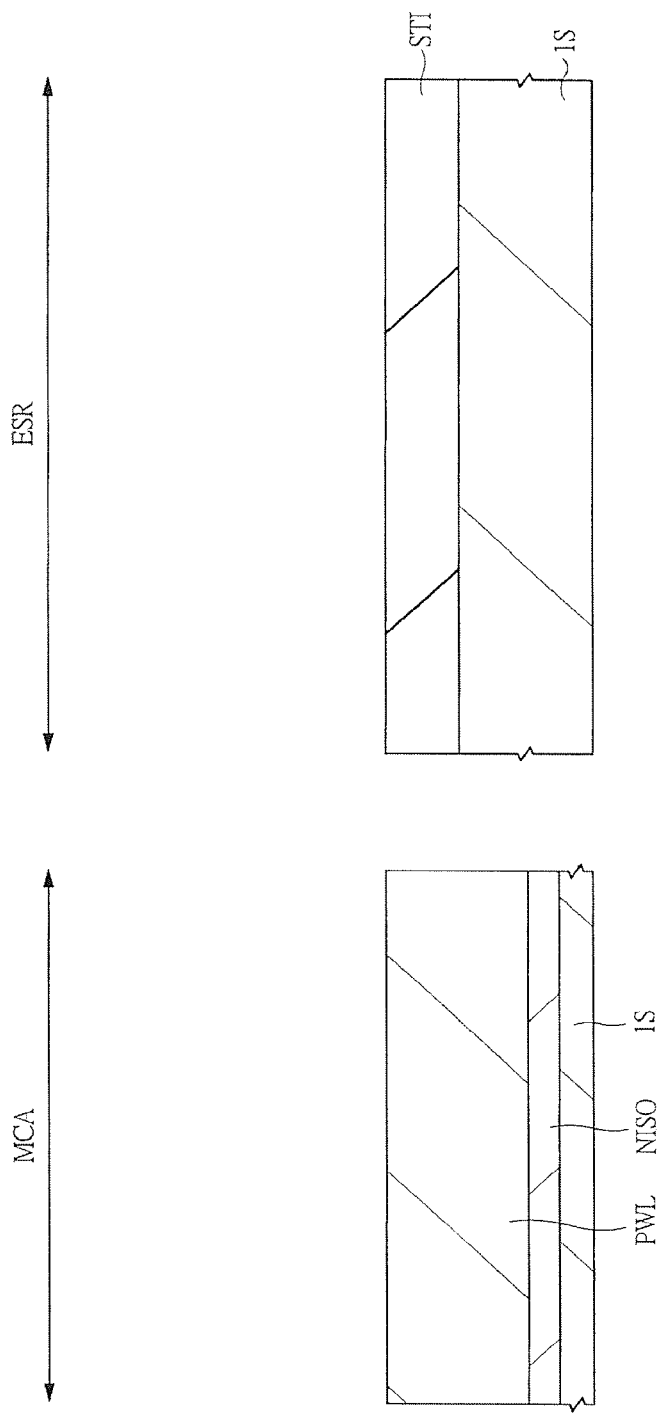
FIG. 15 is a section view showing a manufacturing process of the non-volatile memory semiconductor device in the first embodiment of the present invention.

First, as shown in FIG. 15, the semiconductor substrate 1S is prepared, which includes a silicon single crystal into which p-type impurities, such as boron (B), have been introduced. At this time, the semiconductor substrate 1S is in a state of a semiconductor wafer in substantially the shape of a disc. Then, the element isolation region STI is formed in the electricity supply region ESR of the semiconductor substrate 1S. The element isolation region STI is provided in order to prevent interference between elements. The element isolation region STI can be formed using, for example, the LOCOS (local oxidation of silicon) method or the STI (shallow trench isolation) method. For example, with the STI method, the element isolation region STI is formed as described below. That is, an element isolation groove is formed in the semiconductor substrate 1S using the photolithography technique and the etching technique. Then, a silicon oxide film is formed over the semiconductor substrate 1S so as to be embedded in the element isolation groove, and after that, the unnecessary silicon oxide film formed over the semiconductor substrate 1S is removed by the CMP (chemical mechanical polishing) method. Due to this, it is possible to form the element isolation region STI in which the silicon oxide film is embedded only in the element isolation groove.

Subsequently, the well isolation layer NISO is formed by introducing impurities into the semiconductor substrate 1S in the memory cell array region MCA. The well isolation layer NISO is formed by introducing n-type impurities, such as phosphorus and arsenic, into the semiconductor substrate 1S. Then, the p-type well PWL is formed by introducing impurities into the semiconductor substrate 1S. The p-type well PWL is formed by introducing p-type impurities, for example, boron, into the semiconductor substrate 1S by the ion implantation method.

Figure 16:
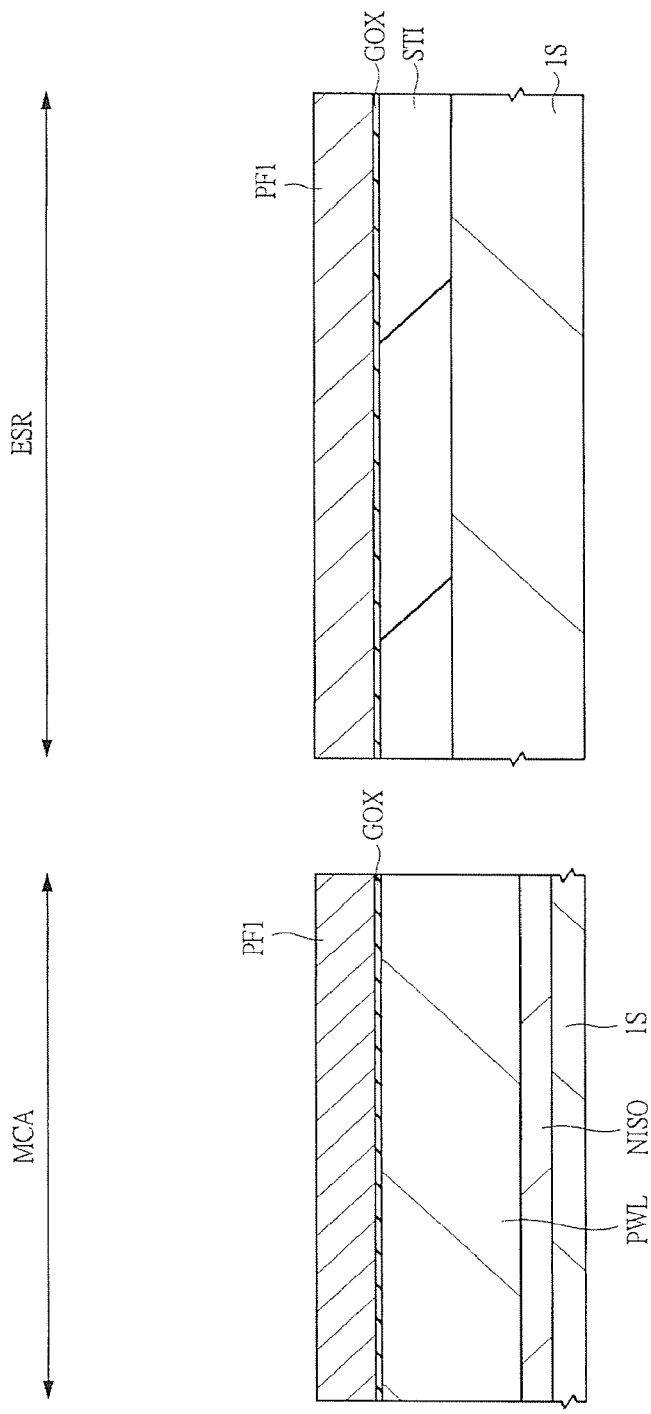
FIG. 16 is a section view showing the manufacturing process of the non-volatile memory semiconductor device, following FIG. 15.

Next, as shown in FIG. 16, the gate insulating film GOX is formed over the semiconductor substrate 1S. The gate insulating film GOX is formed from, for example, a silicon oxide film, and can be formed using, for example, the thermal oxidation method. However, the gate insulating film GOX is not limited to the silicon oxide film, but can be modified in various ways, and the gate insulating film GOX may be formed from, for example, a silicon oxynitride film (SION). That is, it may have a structure in which nitrogen is segregated at the boundary surface between the gate insulating film GOX and the semiconductor substrate 1S. The silicon oxynitride film has a significant effect for suppressing the occurrence of boundary surface level in the film and reducing electron trap compared to the silicon oxide film. As a result, it is possible to improve the hot-carrier resistance of the gate insulating film GOX and the insulation resistance. In addition, the silicon oxynitride film is more unlikely to allow impurities to penetrate therethrough compared to the silicon oxide film. Because of this, by using a silicon oxynitride film as the gate insulating film GOX, it is possible to suppress the variations in the threshold voltage resulting from the diffusion of impurities in the gate electrode to the side of the semiconductor substrate 1S. In order to form a silicon oxynitride film, for example, it is only required to perform heat treatment of the semiconductor substrate 1S in an atmosphere including nitrogen, such as NO, $NO_2$, and $NH_3$. It is also possible to obtain the same effect by performing heat treatment of the semiconductor substrate 1S in an atmosphere including nitrogen after forming the gate insulating film GOX including a silicon oxide film on the surface of the semiconductor substrate 1S, and segregating nitrogen to the boundary surface between the gate insulating film GOX and the semiconductor substrate 1S.

Further, it may also be possible to form the gate insulating film GOX from, for example, a high-k dielectric film having the dielectric constant higher than that of the silicon oxide film. Conventionally, from the standpoint that the insulation resistance is high, the electrical/physical stability at the boundary surface between silicon and silicon oxide is excellent, etc., a silicon oxide film is used as the gate insulating film GOX. However, it has been demanded for the gate insulating film GOX to be extremely thin accompanying the miniaturization of element. If such a thin silicon oxide film is used as the gate insulating film GOX, a so-called tunneling current is caused by electrons that flow through the channel of MISFET, tunneling the barrier wall formed from the silicon oxide film and flowing to the gate electrode.

Because of this, a material having a dielectric constant higher than that of the silicon oxide film is used and thereby a high-k dielectric film begins to be used recently, which has the same capacitance but is capable of increasing physical film thickness. With a high-k dielectric film, it is possible to increase the physical film thickness with the same capacitance, and therefore, the leak current can be reduced. In particular, although the silicon nitride film has a dielectric constant higher than that of the silicon oxide film, it is desirable to use a high-k dielectric film having a dielectric constant higher than that of the silicon nitride film in the first embodiment.

For example, as a high-k dielectric film having a dielectric constant higher than that of the silicon nitride film, a hafnium oxide film ($HfO_2$ film) is used, which is one of hafnium oxides, however, instead of the hafnium oxide film, other hafnium-based insulating films, such as a hafnium aluminate film, HfON film (hafnium oxynitride film), HfSiO film (hafnium silicate film), HfSiON film (hafnium silicon oxynitride film), and HfAlO film, can be used. Further, hafnium-based insulating films that have introduced oxides therein, such as tantalum oxide, niobium oxide, titanium oxide, zirconium oxide, lanthanum oxide, and yttrium oxide, can also be used. Since the hafnium-based insulating film has a dielectric constant higher than that of the silicon oxide film and the silicon oxynitride film, like the hafnium oxide film, the same effect when the hafnium oxide film is used can be obtained.

Next, the polysilicon film PF1 is formed over the gate insulating film GOX. The polysilicon film PF1 can be formed using, for example, the CVD method. Then, using the photolithography technique and the ion implantation method, n-type impurities, such as phosphorus and arsenic, are introduced into the polysilicon film PF1.

Figure 17:
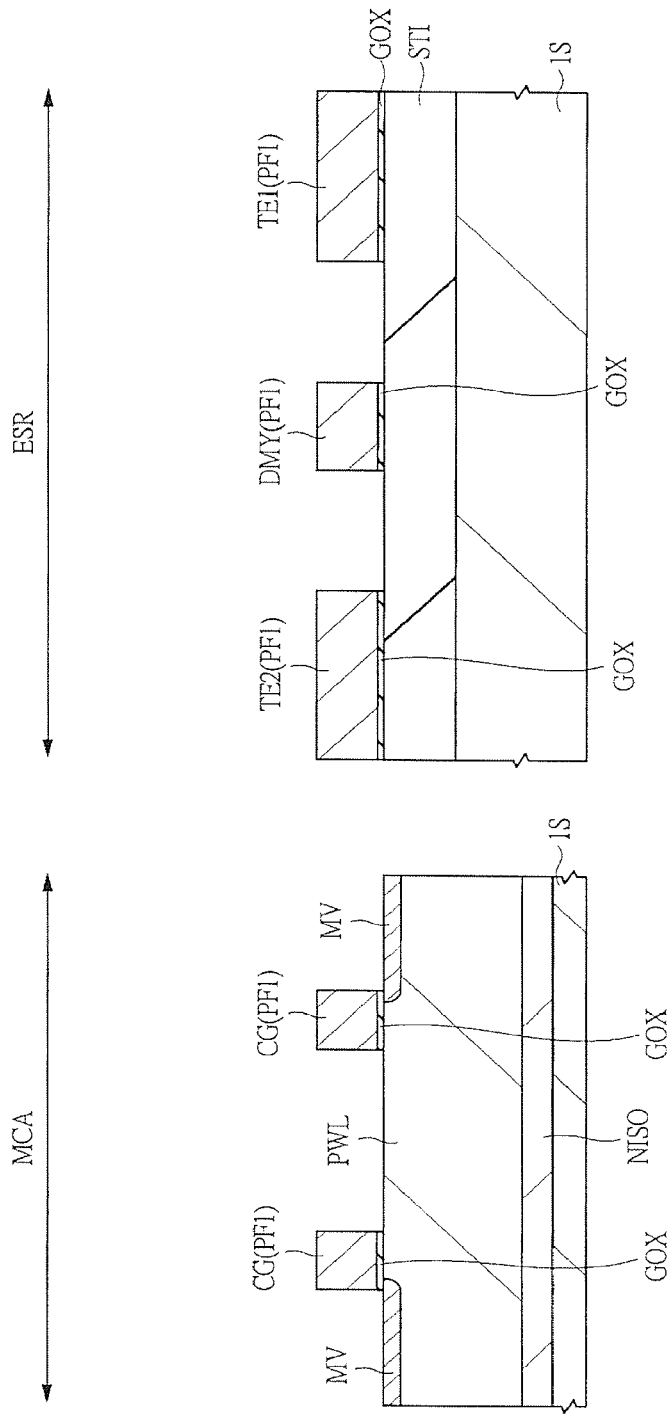
FIG. 17 is a section view showing the manufacturing process of the non-volatile memory semiconductor device, following FIG. 16.

Subsequently, as shown in FIG. 17, the polysilicon film PF1 is processed by etching using a patterned resist film as a mask to form the control gate electrode CG in the memory cell array region MCA and then the terminal end TE1, the terminal end TE2, and the dummy part DMY are formed in the electricity supply region ESR. As described above, the control gate electrode CG formed in the memory cell array region MCA and the terminal end TE1, the terminal end TE2, and the dummy part DMY formed in the electricity supply region ESR are formed by processing the same polysilicon film PF1. Because of this, the terminal end TE1, the terminal end TE2, and the dummy part DMY have substantially the same height. In the electricity supply region ESR, the dummy part DMY is formed between the terminal end TE1 and the terminal end TE2 as a result. Because of this, a step is generated by the gap between the terminal end TE1 and the dummy part DMY and by the gap between the terminal end TE2 and the dummy part DMY. Then, in the memory cell array region MCA, the n-type semiconductor region MV is formed using the photolithography technique and the ion implantation method.

Figure 18:
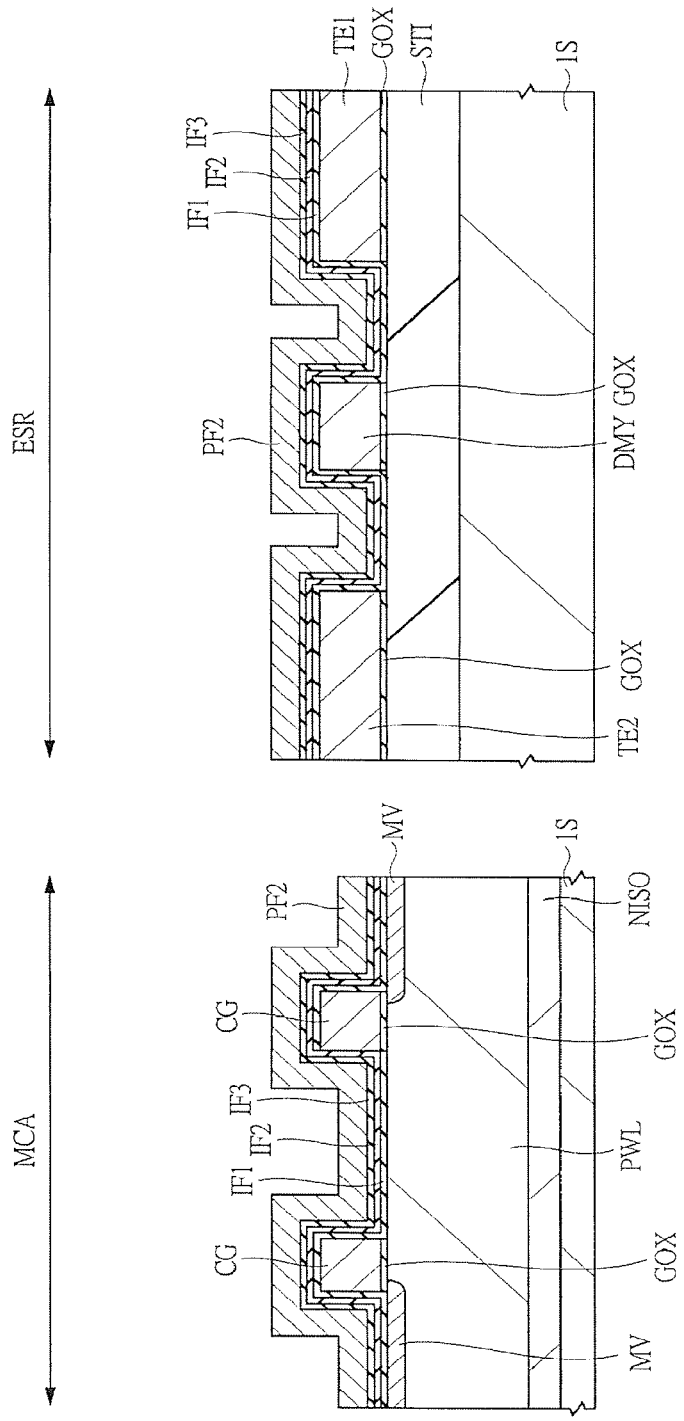
FIG. 18 is a section view showing the manufacturing process of the non-volatile memory semiconductor device, following FIG. 17.

After that, as shown in FIG. 18, over the semiconductor substrate 1S, a laminated film of the silicon oxide film IF1, the silicon nitride film IF2, and the silicon oxide film IF3 is formed and over the laminated film, the polysilicon film PF2 is formed. At this time, in the electricity supply region ESR, a laminated film and the polysilicon film PF2 are formed while reflecting the step by the gap between the terminal end TE1 and the dummy part DMY and the step by the gap between the terminal end TE2 and the dummy part DMY.

Figure 19:
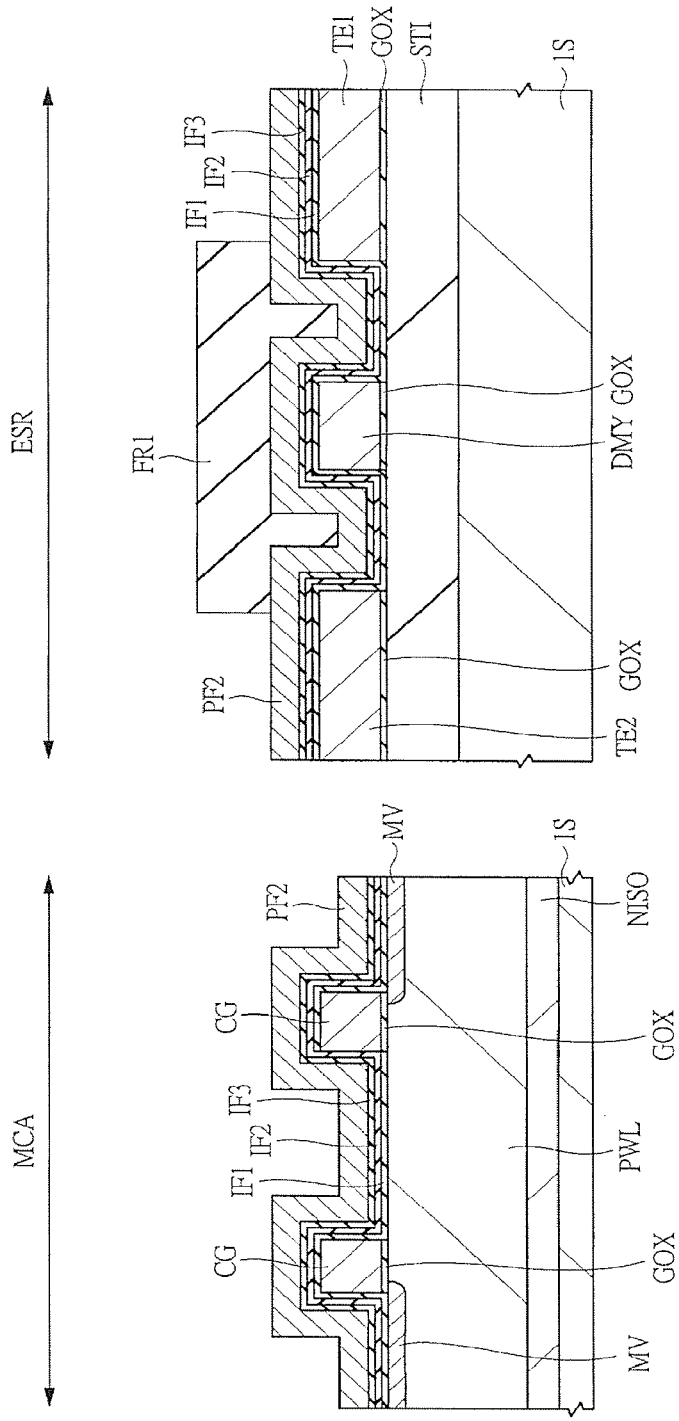
FIG. 19 is a section view showing the manufacturing process of the non-volatile memory semiconductor device, following FIG. 18.
Figure 20:
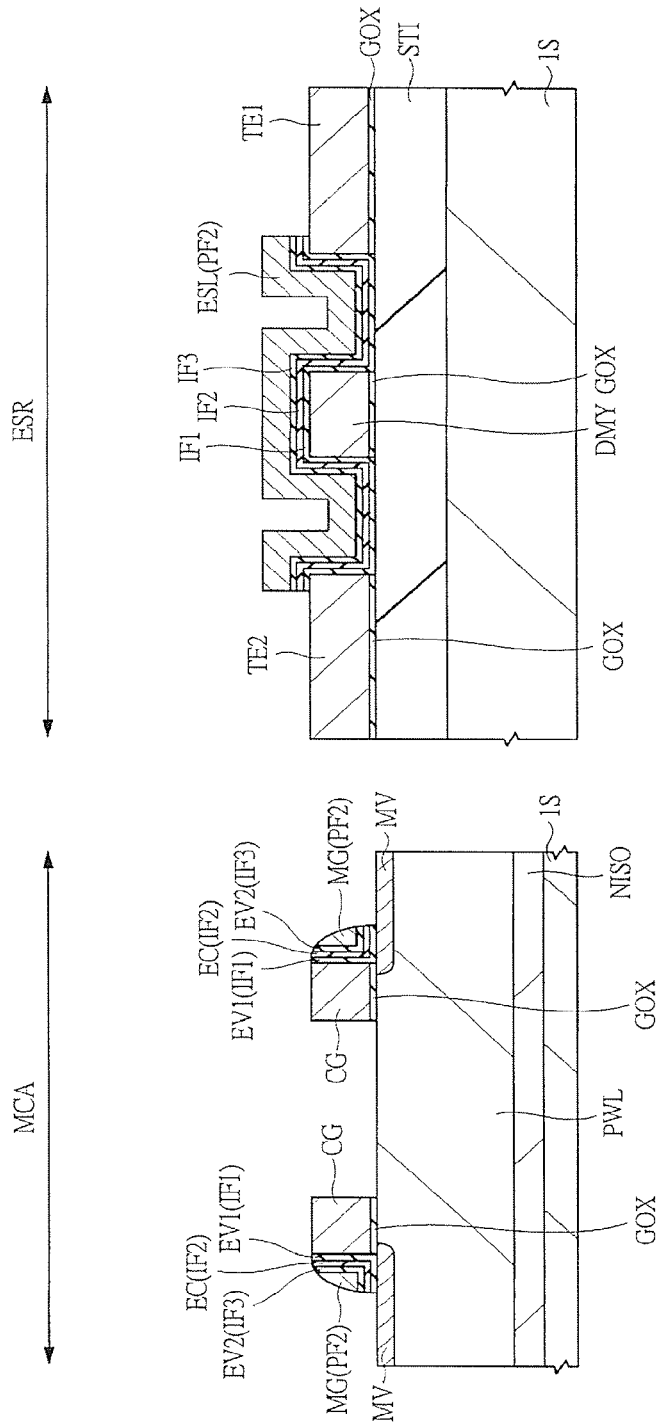
FIG. 20 is a section view showing the manufacturing process of the non-volatile memory semiconductor device, following FIG. 19.

Subsequently, as shown in FIG. 19, after applying the resist film FR1 over the semiconductor substrate 1S, the resist film FR1 is patterned. At this time, in the electricity supply region ESR, it is designed so that the region in which the electricity supply line is formed is to be covered with the resist film FR1. Here, formation is made so that one end of the electricity supply line is arranged over the terminal end TE1 and the other end of the electricity supply line is arranged over the terminal end TE2, and further, the central portion of the electricity supply line is arranged over the dummy part DMY. Due to this, most of the electricity supply line has the same height, and therefore, the resist film FR1 formed over the polysilicon film PF2 has a flat shape. Here, the gap between the terminal end TE1 and the dummy part DMY and the gap between the terminal end TE2 and the dummy part DMY are a very small region, and therefore, the resist film FR1 is not formed in such a manner that the shape of these gaps is faithfully reflected, and therefore, the flatness of the resist film FR1 is maintained. That is, by making most of the electricity supply line have the same height, the height of the resist film FR1 used when patterning the electricity supply line becomes almost constant. As a result, the out-of-focus state when performing the exposure processing of the resist film FR1 is eliminated and the defect in the shape of the resist film FR1 can be suppressed. Because of this, it is possible to form the resist film FR1 that reflects the shape of the normal electricity supply line and to normally pattern the electricity supply line ESL by etching using the patterned resist film FR1 as a mask as shown in FIG. 20. That is, the polysilicon film PF2 and the laminated film (silicon oxide film IF1, silicon nitride film IF2, silicon oxide film IF3), which are a front-end, are etched using the patterned resist film FR1 as a mask. Then, in the electricity supply region ESR, the electricity supply line ESL including the polysilicon film PF2 is formed. The electricity supply line ESL formed at this time is normally formed in a state of being very close to the design values because the resist film FR1 is normally patterned.

On the other hand, in the memory cell array region MCA, it is possible to form the memory gate electrode MG having a sidewall shape on the sidewall of the control gate electrode CG via the laminated film by etching the polysilicon film PF2 and the laminated film (silicon oxide film IF1, silicon nitride film IF2, silicon oxide film IF3). At this time, the laminated film includes the silicon oxide film IF1, the silicon nitride film IF2, and the silicon oxide film IF3 and, for example, the silicon oxide film IF1 functions as the potential barrier film EV1 and the silicon nitride film IF2 functions as the charge storage film EC. Further, the silicon oxide film IF3 functions as the potential barrier film EV2. When the polysilicon film PF2 and the laminated film are subjected to anisotropic etching, the memory gate electrode MG is formed on the sidewall on both sides of the control gate electrode CG, however, after that, the memory gate electrode MG formed on the sidewall on one of the sides of the control gate electrode CG is removed using the photolithography technique and the etching technique.

Figure 21:
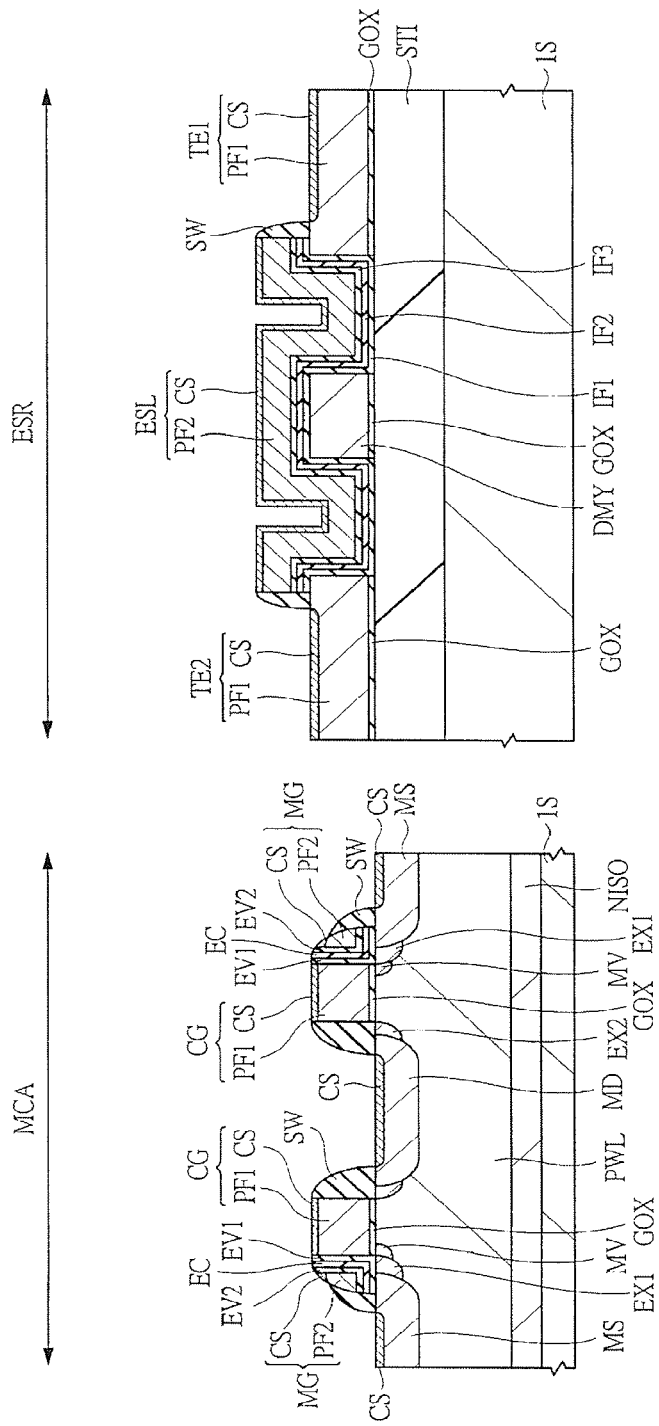
FIG. 21 is a section view showing the manufacturing process of the non-volatile memory semiconductor device, following FIG. 20.

Next, as shown in FIG. 21, in the memory cell array region MCA, the shallow low-concentration impurity diffusion regions EX1, EX2 in alignment with the control gate electrode CG and the memory gate electrode MG are formed using the photolithography technique and the ion implantation method. The shallow low-concentration impurity diffusion regions EX1, EX2 are an n-type semiconductor region into which n-type impurities, such as phosphorus and arsenic, have been introduced.

After that, a silicon oxide film is formed over the semiconductor substrate 1S. The silicon oxide film can be formed using, for example, the CVD method. Then, by subjecting the silicon oxide film to anisotropic etching, the sidewall SW is formed. In the memory cell array region MCA, the sidewall SW is formed on the sidewall of the control gate electrode CG and on the sidewall of the memory gate electrode MG. Similarly, in the electricity supply region ESR, the sidewall SW is formed on the sidewall of both end portions of the electricity supply line ESL. Although these sidewalls SW are formed from a single layer film of silicon oxide film, this is not limited and, for example, it may also be possible to form the sidewall SW including a laminated film of a silicon nitride film and a silicon oxide film.

Subsequently, using the photolithography technique and the ion implantation method, the deep high-concentration impurity diffusion regions MS, MD in alignment with the sidewall SW are formed in the memory cell array region MCA. The deep high-concentration impurity diffusion regions MS, MD are an n-type semiconductor region into which n-type impurities, such as phosphorus and arsenic, have been introduced. The deep high-concentration impurity diffusion regions MS, MD and the shallow low-concentration impurity diffusion regions EX1, EX2 form the source region or drain region of the memory cell. As described above, by forming the source region and the drain region by the shallow low-concentration impurity diffusion regions EX1, EX2 and the deep high-concentration impurity diffusion regions MS, MD, it is possible to cause the source region and the drain region to have a lightly doped drain (LDD) structure. After forming the deep high-concentration impurity diffusion regions MS, MD in this manner, heat treatment at a temperature of about 1,000° C. is performed. Due to this, the introduced impurities are activated.

Next, after forming a cobalt film over the semiconductor substrate 1S, by performing heat treatment, the polysilicon films PF1, PF2 constituting the control gate electrode CG and the memory gate electrode MG are caused to react with the cobalt film to form the cobalt silicide film CS in the memory cell array region MCA. Due to this, the control gate electrode CG and the memory gate electrode MG have a laminated structure of the polysilicon films PF1, PF2 and the cobalt silicide film CS, respectively. Similarly, on the surface of the high-concentration impurity diffusion regions MS, MD also, the silicon and cobalt films react and the cobalt silicide film CS is formed.

On the other hand, in the electricity supply region ESR also, the cobalt silicide film CS is formed on the surface of the polysilicon film PF2 constituting the electricity supply line ESL. Due to this, the electricity supply line ESL includes the polysilicon film PF2 and the cobalt silicide film CS as a result. In the first embodiment, the configuration is made so that the cobalt silicide film CS is formed, however, it may also be possible to form, for example, a nickel silicide film or a titanium silicide film in place of the cobalt silicide film CS.

As described above, it is possible to form a plurality of memory cells in the memory cell array region MCA of the semiconductor substrate 1S and form the electricity supply line ESL in the electricity supply region ESR.

Figure 22:
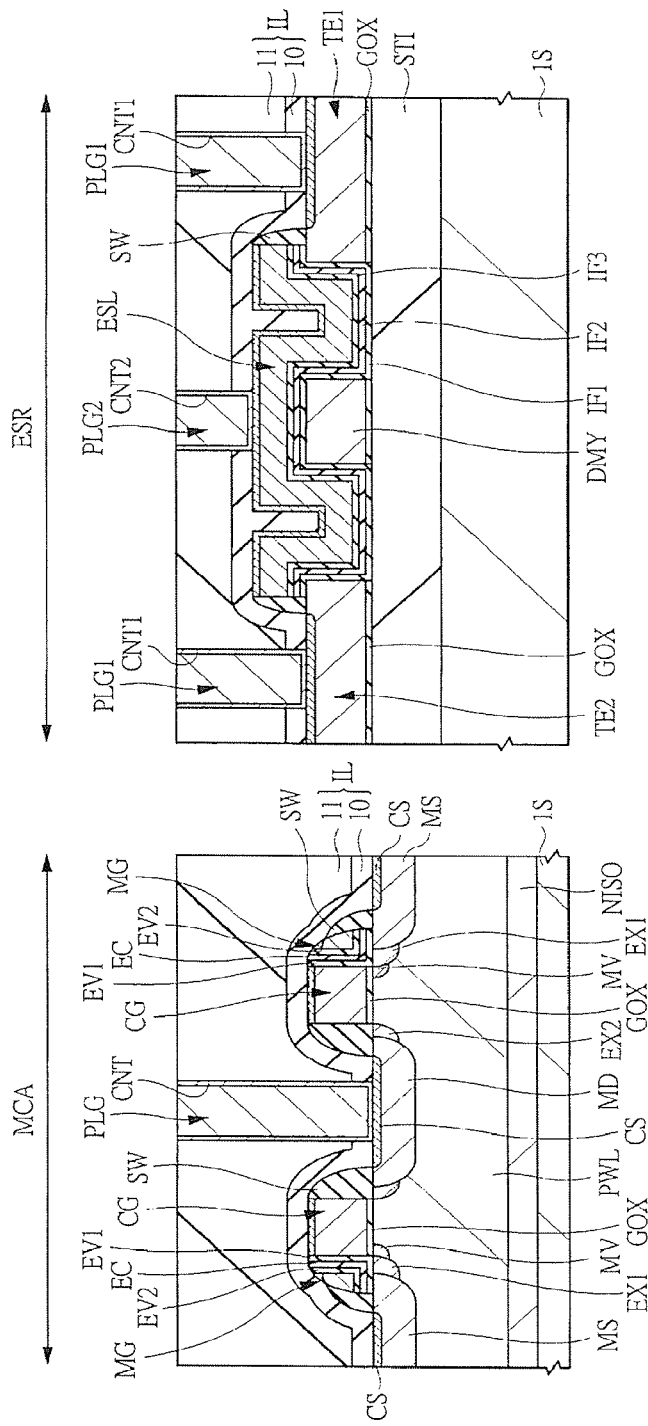
FIG. 22 is a section view showing the manufacturing process of the non-volatile memory semiconductor device, following FIG. 21.

Next, the wiring process will be described with reference to FIG. 22. As shown in FIG. 22, the interlayer insulating film IL is formed over the main surface of the semiconductor substrate 1S. The interlayer insulating film IL is formed from, for example, the silicon nitride film 10 and the silicon oxide film 11. Then, the surface of the interlayer insulating film IL is planarized using, for example, the CMP (Chemical Mechanical Polishing) method.

Subsequently, a contact hole is formed in the interlayer insulating film IL using the photolithography technique and the etching technique. For example, in the memory cell array region MCA, the contact hole CNT is formed and the contact hole CNT1 and the contact hole CNT2 are formed in the electricity supply region ESR.

Then, a titanium/titanium nitride film is formed over the interlayer insulating film IL including the bottoms and the inner walls of the contact holes CNT, CNT1 and CNT2. The titanium/titanium nitride film includes a laminated film of a titanium film and a titanium nitride film and can be formed using, for example, the sputtering method. The titanium/titanium nitride film has so-called barrier properties that prevent tungsten, which is material of a film to be embedded in a subsequent process, from diffusing into silicon.

Then, a tungsten film is formed over the entire main surface of the semiconductor substrate 1S by embedding it in the contact holes CNT, CNT2. The tungsten film can be formed using, for example, the CVD method. Then, it is possible to form the plug PLG, the plug PLG1, and the plug PLG2 by removing the unnecessary titanium/titanium nitride film and tungsten film formed over the interlayer insulating film IL using, for example, the CMP method.

Next, although not shown schematically, over the interlayer insulating film IL and the plugs PLG, PLG1 and PLG2, a titanium/titanium nitride film, an aluminum film containing copper, and a titanium/titanium nitride film are formed in order. These films can be formed using, for example, the sputtering method. Subsequently, these films are patterned using the photolithography technique and the etching technique and thereby a wire is formed. Further, a wire is formed in the upper layer of the wire, however, its description is omitted here. In this manner, it is possible to form the non-volatile memory semiconductor device in the first embodiment finally.

(Second Embodiment)

Figure 23:
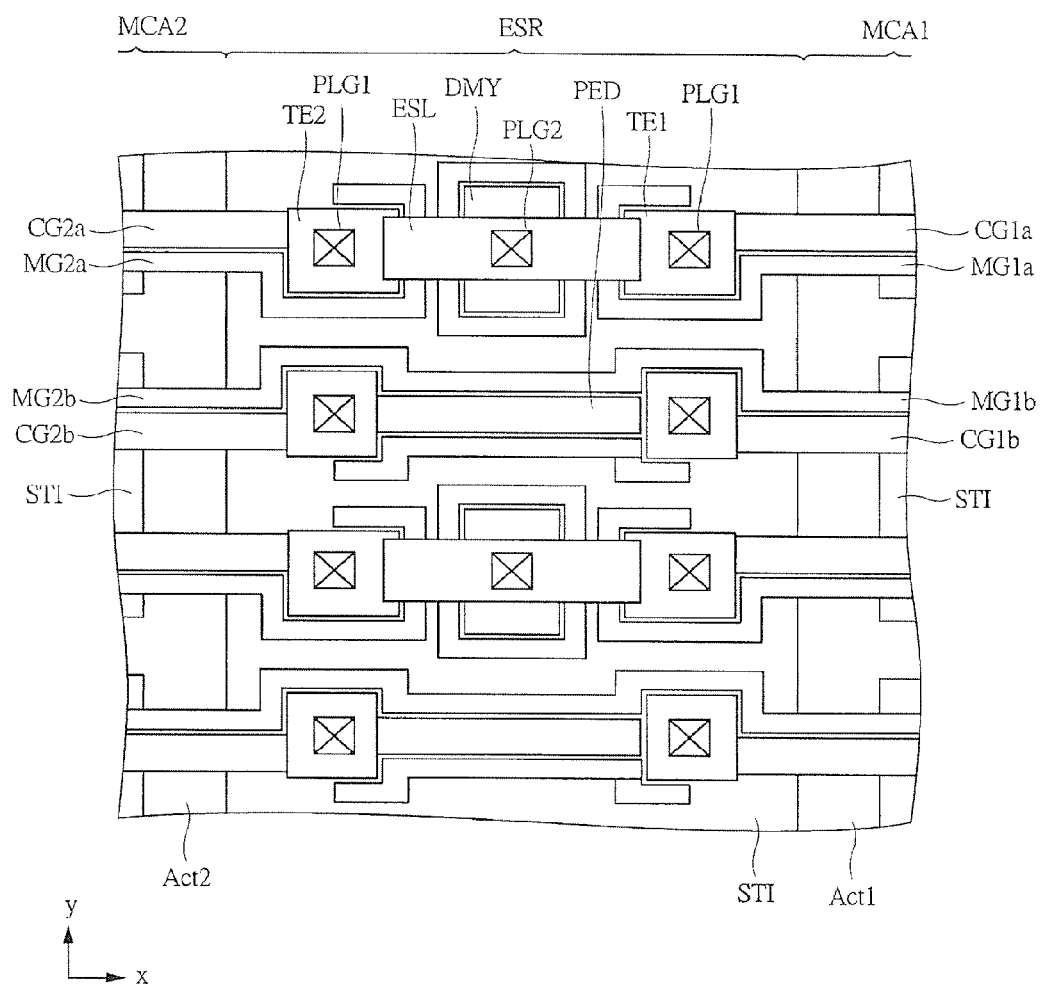
FIG. 23 is a diagram showing a layout configuration of a non-volatile memory semiconductor device in a second embodiment of the present invention.

A non-volatile memory semiconductor device in a second embodiment will be described with reference to the drawing. FIG. 23 is a diagram showing a layout configuration of the non-volatile memory semiconductor device in the second embodiment. The second embodiment differs from the above-mentioned first embodiment in the size of the dummy part DMY formed in the electricity supply region ESR. Specifically, from comparison between FIG. 12 and FIG. 23, it is seen that the width in the y-axis direction of the dummy part DMY shown in FIG. 23 is greater than that in the y-axis direction of the dummy part DMY shown in FIG. 12. The characteristic of the second embodiment lies in that the width in the y-axis direction of the dummy part DMY is made greater than that in the y-axis direction of the terminal end TE1 and that in the y-axis direction of the terminal end TE2 in FIG. 23.

Next, the advantage of making the width in the y-axis direction of the dummy part DMY greater than that in the y-axis direction of the terminal end TE1 and that in the y-axis direction of the terminal end TE2 will be described. As shown in FIG. 23, the electricity supply line ESL is arranged over the terminal end TE1, the terminal end TE2, and the dummy part DMY. At this time, a case is considered, where the electricity supply line ESL is formed so as to shift, for example, in the y-axis direction. In this case, if the width of the dummy part DMY in the y-axis direction is narrow, part of the electricity supply line ESL shifts from over the dummy part DMY even if the electricity supply line ESL slightly shifts in the y-axis direction. Due to this, there is a possibility that the defect in the shape of the electricity supply line ESL becomes more likely to occur. Because of this, in the second embodiment, the dummy part DMY is formed so as to have a comparatively great width in the y-axis direction. Due to this, even if the electricity supply line ESL is formed in a state where it shifts more or less in the y-axis direction, it is possible to arrange the electricity supply line ESL over the dummy part DMY. As a result, the electricity supply line ESL is maintained to be formed stably over the dummy part DMY, and therefore, it is possible to suppress the defect in the shape of the electricity supply line ESL. That is, according to the second embodiment, by making the width of the dummy part DMY in the y-axis direction greater, it is possible to obtain the remarkable effect that the alignment margin can be ensured in the y-axis direction of the electricity supply line ESL.

If the width in the y-axis direction of the dummy part DMY is made greater, there arises a possibility that it comes into contact with the neighboring pedestal part PED, and therefore, the width of the pedestal part PED in the y-axis direction is made narrower as shown in FIG. 23.

(Third Embodiment)

Figure 24:
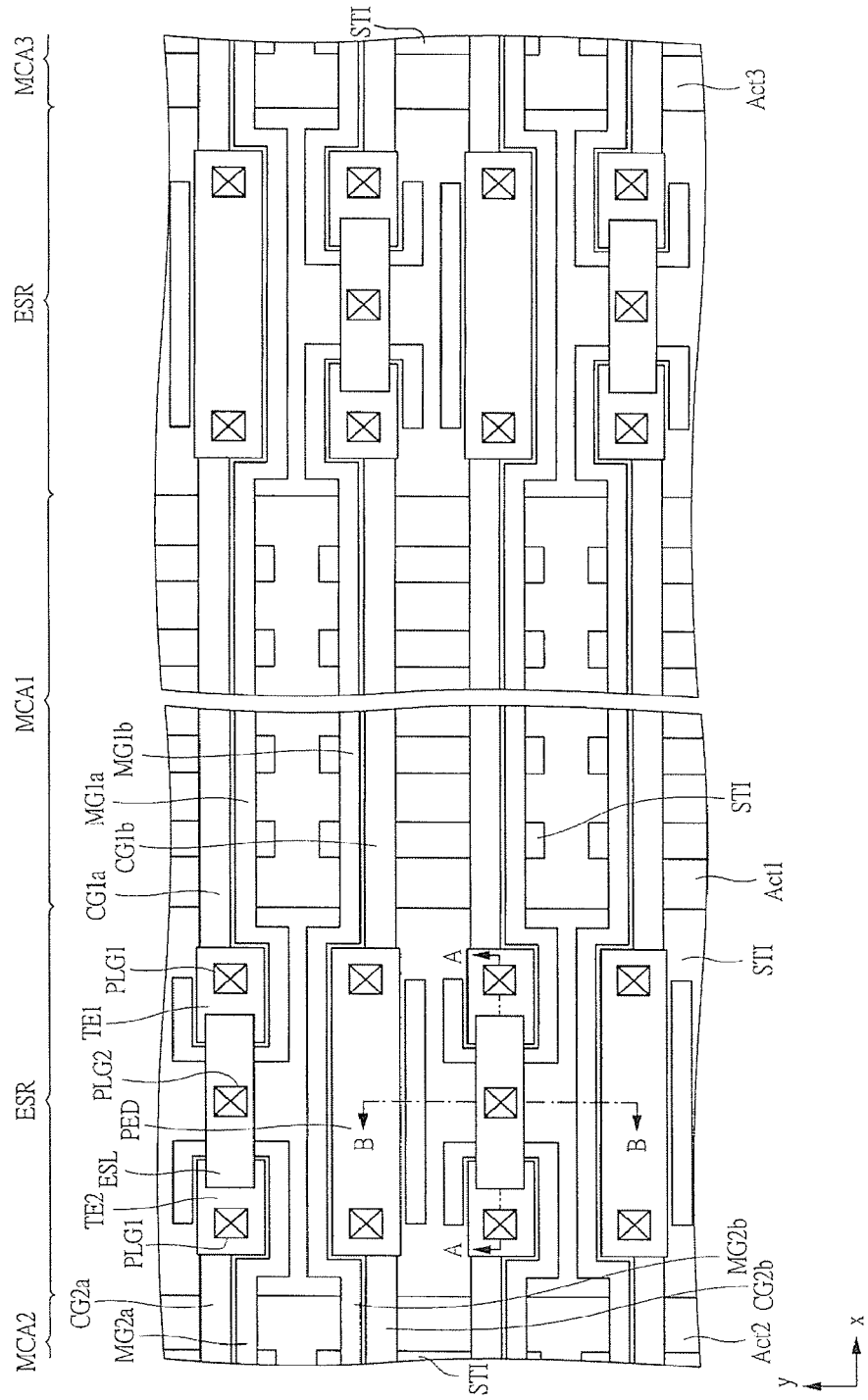
FIG. 24 is a diagram showing a layout configuration of a non-volatile memory semiconductor device in a third embodiment of the present invention.

In the above-mentioned first embodiment, the example is described, in which the dummy part DMY is formed in the electricity supply region ESR, however, in the third embodiment, an example will be described, in which the dummy part DMY is not provided in the electricity supply region ESR. FIG. 24 is a diagram showing a layout configuration of a non-volatile memory semiconductor device in the third embodiment. The layout configuration in the third embodiment shown in FIG. 24 and the layout configuration in the first embodiment shown in FIG. 12 are substantially the same, however, a difference lies in that the dummy part DMY is not provided in the electricity supply region ESR in FIG. 24.

In FIG. 24, the terminal end TE1 and the terminal end TE2 are formed in the electricity supply region ESR and the electricity supply line ESL is arranged so that its one end is arranged over the terminal end TE1 and the other end is arranged over the terminal end TE2. At this time, the dummy part is not provided immediately under the central portion of the electricity supply line ESL.

Figure 25:
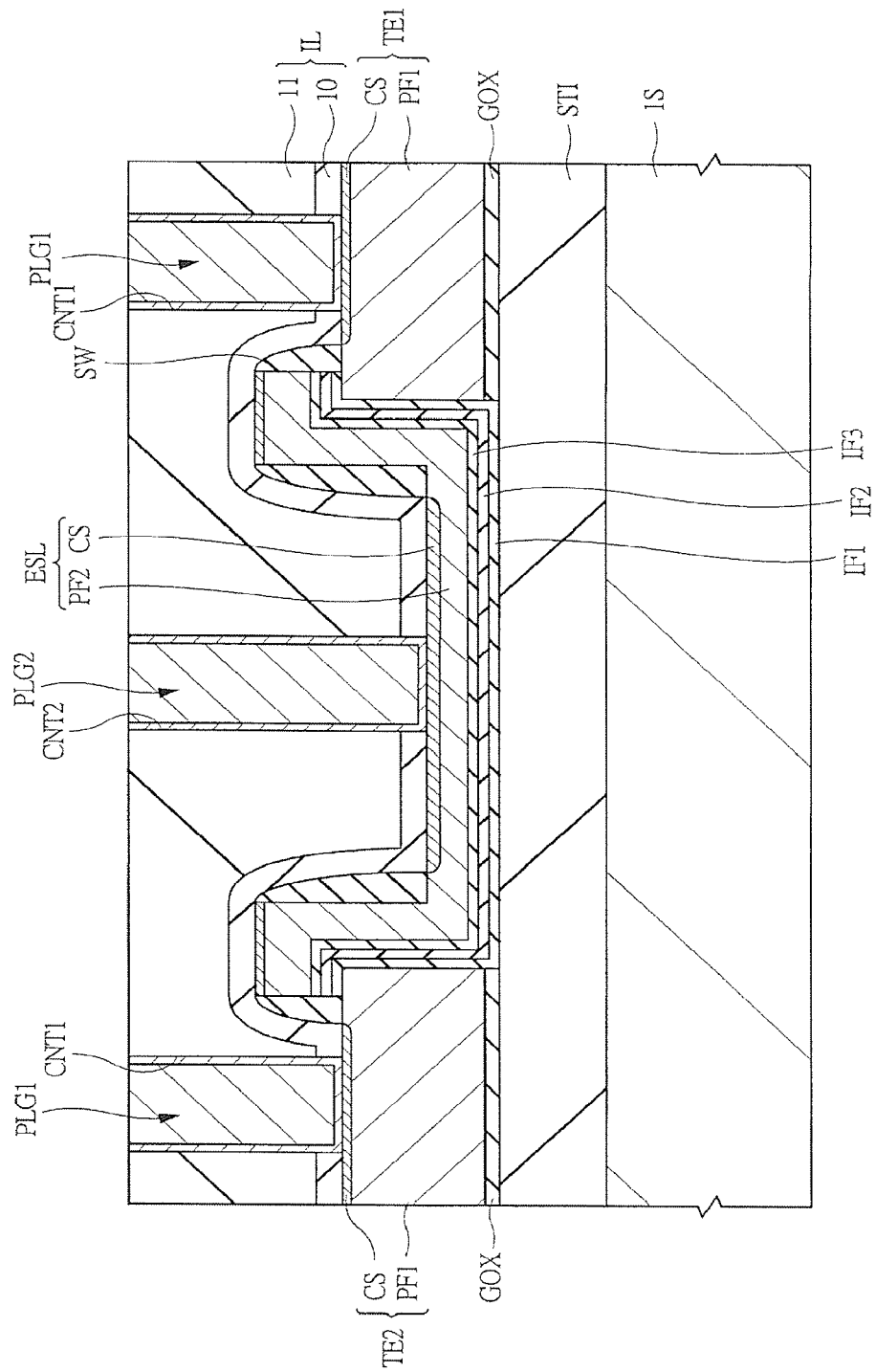
FIG. 25 is a section view cut by A-A line in FIG. 24.

FIG. 25 is a section view cut along A-A line in FIG. 24. As shown in FIG. 25, over the semiconductor substrate 1S, the element isolation region STI is formed and over the element isolation region STI, the terminal end TE1 and the terminal end TE2 are formed via the gate insulating film GOX. The terminal end TE1 and the terminal end TE2 are formed so as to have substantially the same height and the polysilicon film PF1 that constitutes the terminal end TE1 and the terminal end TE2 is the same film as that which constitutes the control gate electrode CG1a and the control gate electrode CG2a shown in FIG. 24. On the surface of the polysilicon film PF1 constituting the terminal end TE1 and the terminal end TE2, the cobalt silicide film CS is formed.

As shown in FIG. 25, the electricity supply line ESL is formed extending from the terminal end TE1 to the terminal end TE2. Specifically, a laminated film is formed so as to extend from over the element isolation region STI to the side surface and part of the top surface of the terminal end TE2 after passing part of the top surface and the side surface of the terminal end TE1 then, over the element isolation region STI, and the electricity supply line ESL is formed over the laminated film. The laminated film includes the silicon oxide film IF1, the silicon nitride film IF2, and the silicon oxide film IF3. On the other hand, the electricity supply line ESL is formed from the polysilicon film PF2 and the cobalt silicide film CS formed on the surface of the polysilicon film PF2. The polysilicon film PF2 that constitutes the electricity supply line ESL is the same film as that which constitutes the memory gate MG1a and the memory gate MG2a shown in FIG. 12.

As described above, in the third embodiment, one end of the electricity supply line ESL is arranged over the terminal end TE1 and the other end of the electricity supply line ESL is arranged over the terminal end TE2. On the other hand, the central portion of the electricity supply line ESL is arranged over the element isolation region STI as a result.

As shown in FIG. 25, on the sidewall on both sides of the electricity supply line ESL, the sidewall SW is formed and the interlayer insulating film IL is formed so as to cover the electricity supply line ESL, the terminal end TE1, and the terminal end TE2. The interlayer insulating film IL is formed from, for example, the silicon nitride film 10 and the silicon oxide film 11. Then, in the interlayer insulating film IL, the contact hole CNT1 that reaches the terminal end TE1 and the terminal end TE2 is formed and the plug PLG1 is formed by embedding a conductive material including a titanium/titanium nitride film and a tungsten film in the contact hole CNT1. To the plug PLG1, a wire, not shown schematically, is connected, and thereby, a voltage is supplied to the terminal end TE1 and the terminal end TE2 via the plug PLG1. The terminal end TE1 is electrically connected with the control gate electrode CG1a shown in FIG. 24 and the terminal end TE2 is electrically connected with the control gate electrode CG2a shown in FIG. 24, and therefore, a voltage is supplied from the plug PLG1 to the control gate electrode CG1a via the terminal end TE1 and a voltage is supplied from the plug PLG1 to the control gate electrode CG2a via the terminal end TE2 as a result.

Further, as shown in FIG. 25, in the interlayer insulating film IL, the contact hole CNT2 that reaches the electricity supply line ESL is formed and the plug PLG2 is formed by embedding a conductive material including a titanium/titanium nitride film and a tungsten film in the contact hole CNT2. To the plug PLG2, a wire, not shown schematically, is connected, and thereby, a voltage is supplied to the electricity supply line ESL via the plug PLG2. The electricity supply line ESL is electrically connected with the memory gate electrode MG1a and the memory gate electrode MG2a shown in FIG. 24, and therefore, a voltage is supplied from the plug PLG2 to the memory gate electrode MG1a and the memory gate electrode MG2a via the electricity supply line ESL as a result.

Figure 26:
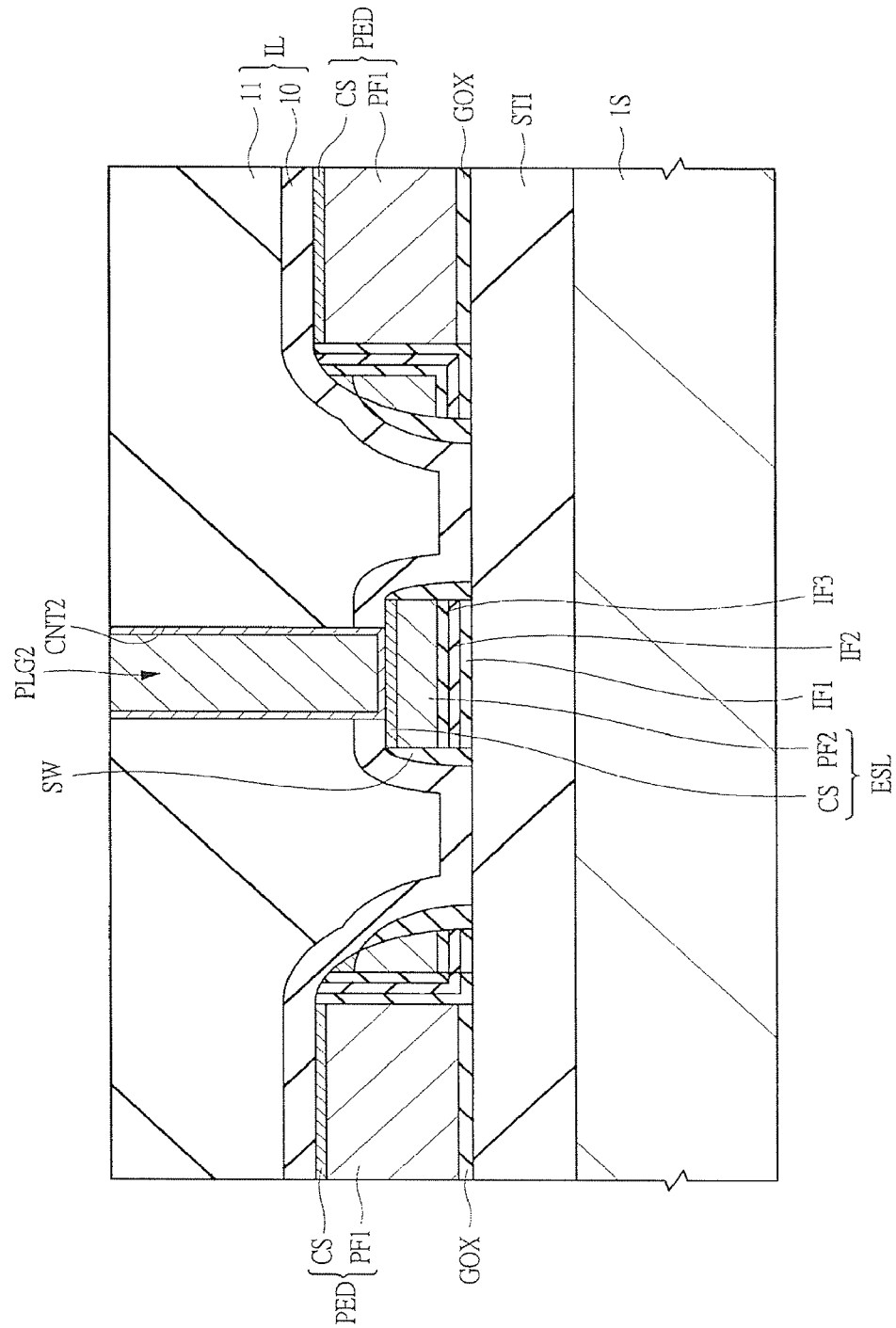
FIG. 26 is a section view cut by B-B line in FIG. 24.

Next, FIG. 26 is a section view cut along B-B line in FIG. 24. As shown in FIG. 26, over the semiconductor substrate 1S, the element isolation region STI is formed and over the element isolation region STI, the pedestal part PED is formed via the gate insulating film GOX. The pedestal part PED is formed by processing the polysilicon film PF1. Then, the pedestal part PED includes the polysilicon film PF1 and the cobalt silicide film CS formed on the surface of the polysilicon film PF1. The polysilicon film PF1 that constitutes the pedestal part PED is the same film as that which constitutes the control gate electrode CG1b and the control gate electrode CG2b shown in FIG. 24.

On the sidewall of the pedestal part PED and over the element isolation region STI between the pedestal parts PED, the polysilicon film PF2 is formed via a laminated film. At this time, the laminated film includes the silicon oxide film IF1, the silicon nitride film IF2, and the silicon oxide film IF3. The polysilicon film PF2 formed over the element isolation region STI between the pedestal parts PED constitutes the electricity supply line ESL and the electricity supply line ESL is formed from the polysilicon film PF2 and the cobalt silicide film CS formed on the surface of the polysilicon film PF1.

Over the semiconductor substrate 1S including over the pedestal part PED and over the electricity supply line ESL, the interlayer insulating film IL is formed. The interlayer insulating film IL is formed from the silicon nitride film 10 and the silicon oxide film 11. Then, the contact hole CNT2 that penetrates through the interlayer insulating film IL and reaches the electricity supply line ESL is formed, and the plug PLG2 is formed by embedding a conductive material including a titanium/titanium nitride film and a tungsten film in the contact hole CNT2. A wire, not shown schematically, is connected to the plug PLG2 and thereby a voltage is supplied to the electricity supply line ESL via the plug PLG2. The electricity supply line ESL is electrically connected with the memory gate MG1a and the memory gate MG2a shown in FIG. 12, and therefore, a voltage is supplied from the plug PLG2 to the memory gate MG1a and the memory gate MG2a via the electricity supply line ESL.

The non-volatile memory semiconductor device in the third embodiment is configured as described above and its characteristic is that the configuration is made so that the heights of both end portions of the electricity supply line ESL are the same. Due to this, it is possible to suppress the generation of a step between both end portions of the electricity supply line ESL. As described in the comparative example, if a step is generated between both end portions of the electricity supply line ESL, the resist film used when patterning the electricity supply line ESL also comes to have a shape that reflects the step. Because of this, the patterning of the resist film is not performed normally and both end portions of the electricity supply line ESL contract. That is, the contraction of the electricity supply line ESL tends to become actual as a problem when a step is generated between both end portions of the electricity supply line ESL, however, even if a step is generated at a part other than both end portions of the electricity supply line ESL, the contraction of the electricity supply line ESL hardly takes place and it does not become actual as a big problem. Because of this, in the third embodiment, the heights of both end portions of the electricity supply line ESL are made the same. As a result, it is possible to suppress the out-of-focus state of exposure light when performing exposure processing at both end portions of the electricity supply line ESL, and therefore, the resist film is formed normally.

However, in the third embodiment, the dummy part is not provided immediately under the central portion of the electricity supply line ESL, and therefore, a step is generated between both end portions and the central portion of the electricity supply line ESL as shown in FIG. 25. In this case, the exposure processing of a resist film is performed with the resist film formed on both end portions of the electricity supply line ESL being focused on. Because of this, it can be conceived that the resist film formed over the central portion of the electricity supply line ESL is brought into an out-of-focus state. However, even if the exposure processing is performed in the state where the resist film formed over the central portion of the electricity supply line ESL is in an out-of-focus state, a serious problem will not arise because the resist film is a film that covers the central portion of the electricity supply line ESL. That is, the contraction of the electricity supply line ESL due to the defect in the shape of the resist film becomes actual as a problem when a step is generated at both end portions of the electricity supply line ESL, however, the contraction of the electricity supply line ESL hardly occurs even if a step is generated at a position other than both end portions of the electricity supply line ESL, and it will not become actual as a serious problem. That is, in the third embodiment, the configuration is made so that at least the heights of both end portions of the electricity supply line ESL are the same, and therefore, it is possible to pattern the electricity supply line ESL in a state close to the normal state. Because of this, according to the third embodiment, it is possible to improve the reliability of a non-volatile memory semiconductor device.

(Fourth Embodiment)

In a fourth embodiment, an example will be described, in which the shape of a resist film used as a mask when the electricity supply line ESL is patterned is devised on the premise that no dummy part is provided immediately under the central portion of the electricity supply line ESL.

Figure 27:
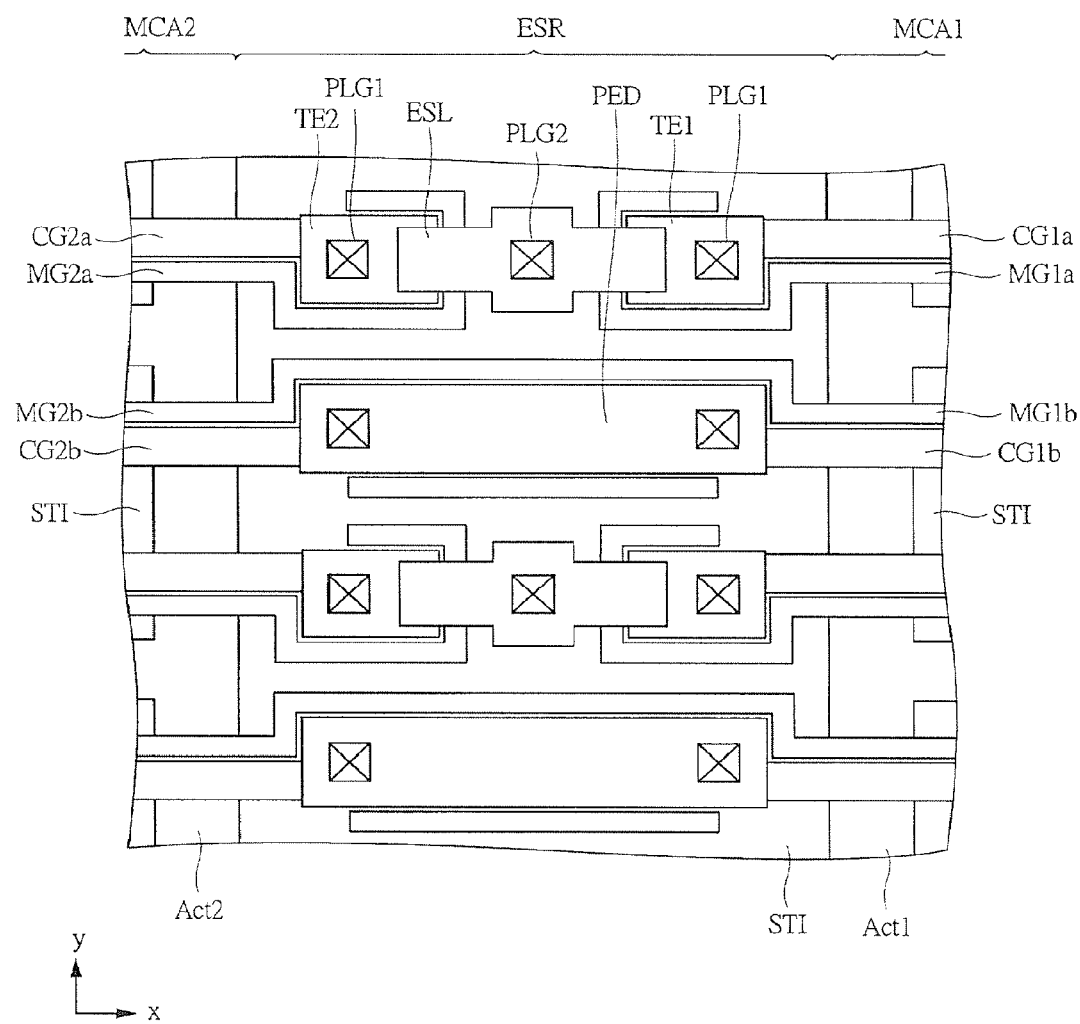
FIG. 27 is a diagram showing a layout configuration of a non-volatile memory semiconductor device in a fourth embodiment of the present invention.

FIG. 27 is a diagram showing a layout configuration of a non-volatile memory semiconductor device in the fourth embodiment. In FIG. 27, the characteristic of the fourth embodiment is that the width of the central portion of the electricity supply line ESL is made greater than that of the end portion of the electricity supply line ESL. Specifically, as shown in FIG. 27, the electricity supply line ESL is formed so that its one end is arranged over the terminal end TE1 and the other end is arranged over the terminal end TE2. At this time, no dummy part is provided immediately under the central portion of the electricity supply line ESL. Because of this, both end portions of the electricity supply line ESL have the same height, however, a step is generated between both end portions and the central portion of the electricity supply line ESL.

It is conceived that an out-of-focus state of the resist film formed over the central portion of the electricity supply line ESL occurs if exposure processing of the resist film is performed with the resist film formed over both end portions of the electricity supply line ESL being focused on when the electricity supply line ESL is formed. However, as described also in the above-mentioned third embodiment, even if the exposure processing is performed in the state where the resist film formed on the central portion of the electricity supply line ESL is in an out-of-focus state, a serious problem will not arise because the resist film is a film that covers the central portion of the electricity supply line ESL. That is, the contraction of the electricity supply line ESL due to the defect in the shape of the resist film becomes actual as a problem when a step is generated at both end portions of the electricity supply line ESL, however, the contraction of the electricity supply line ESL hardly occurs even if a step is generated at a position other than both end portions of the electricity supply line ESL, and it will not become actual as a serious problem.

The defect in the shape of the resist film due to the out-of-focus state at the central portion of the electricity supply line ESL does not become actual as the contraction of the electricity supply line ESL but becomes actual as a phenomenon that the width of the electricity supply line ESL (width in the y-axis direction) becomes narrower. Because of this, in the fourth embodiment, patterning is performed so that the width of the central portion (width in the y-axis direction) of the electricity supply line ESL is made greater than that of both end portions (width in the y-axis direction) of the electricity supply line ESL. Due to this, at the central portion of the electricity supply line ESL, it is possible to suppress the width of the wire at the central portion of the electricity supply line ESL from becoming narrower even if the defect in the shape of the resist film occurs because of the out-of-focus state. That is, if patterning is performed under the condition that the width of the central portion of the electricity supply line ESL becomes greater than that of both end portions in advance, it is possible to suppress the width of the central portion of the electricity supply line ESL from becoming narrower than that of both end portions of the electricity supply line ESL even if the width of the wire is reduced.

Further, if the width of the central portion of the electricity supply line ESL is made greater than that of both end portions of the electricity supply line ESL, an effect to be described below is also obtained. That is, as shown in FIG. 27, in the fourth embodiment, the central portion of the electricity supply line ESL functions as a region that is connected with the plug PLG2. Because of this, if the width of the central portion of the electricity supply line ESL is made greater, it is made easy to maintain conduction with the plug PLG2. In other words, according to the fourth embodiment, by making greater the width of the central portion of the electricity supply line ESL, a remarkable effect can be obtained that it is possible to make an attempt to extend the alignment margin with the plug PLG2. As a result, according to the fourth embodiment, the reliability of a non-volatile memory semiconductor device can be improved.

(Fifth Embodiment)

Figure 28:
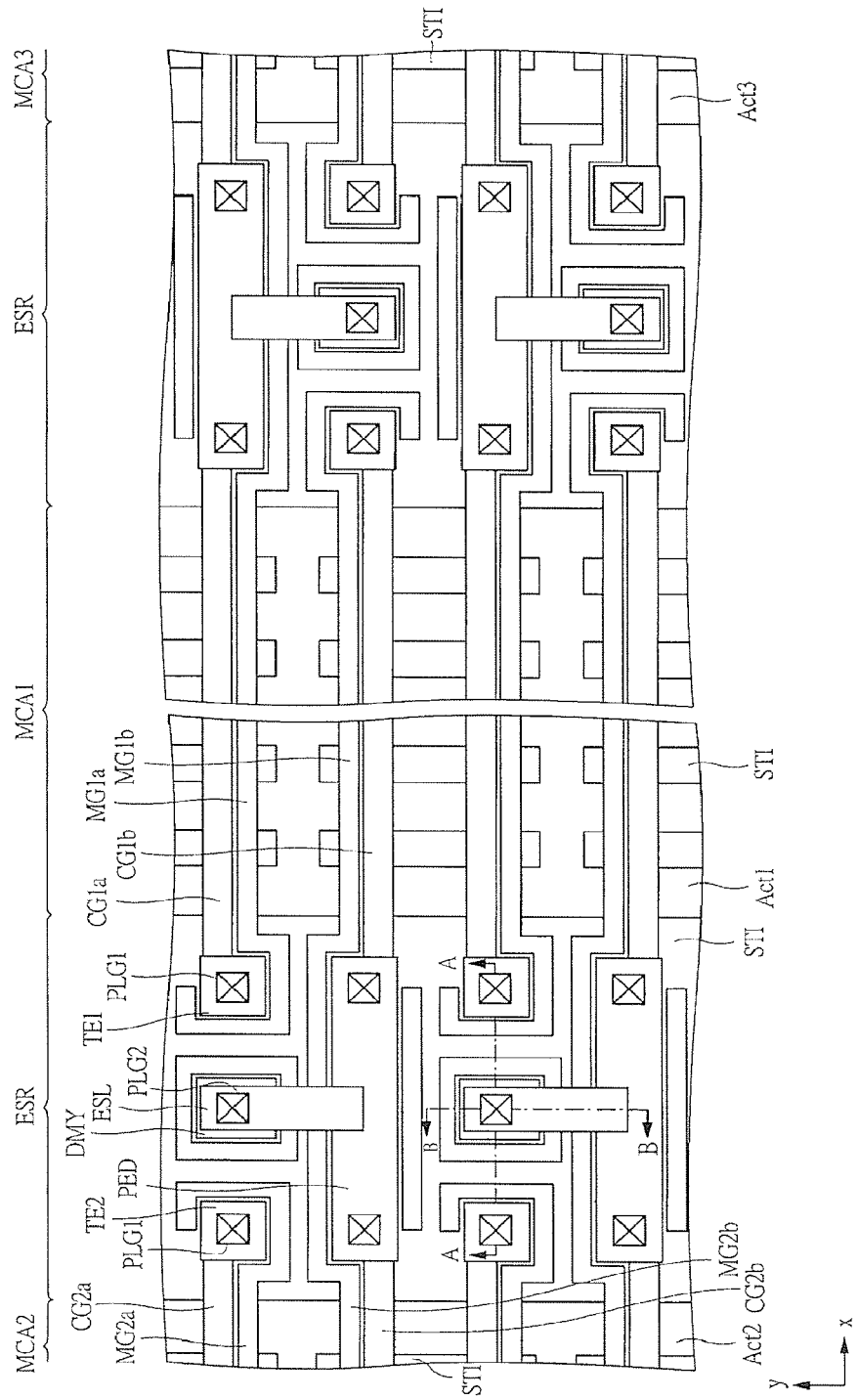
FIG. 28 is a diagram showing a layout configuration of a non-volatile memory semiconductor device in a fifth embodiment of the present invention.

In a fifth embodiment, an example will be described, in which the electricity supply line ESL is provided between the dummy part DMY and the pedestal part PED. FIG. 28 is a diagram showing a layout configuration of a non-volatile memory semiconductor device in the fifth embodiment. The layout configuration in the fifth embodiment shown in FIG. 28 and the layout configuration in the above-mentioned first embodiment shown in FIG. 12 are substantially the same, however, a difference lies in that the electricity supply line ESL extends from the dummy part DMY to the pedestal part PED in the electricity supply region ESR in FIG. 28.

In FIG. 28, in the electricity supply region ESR, the terminal end TE1 and the terminal end TE2 are formed and the dummy part DMY is provided between the terminal end TE1 and the terminal end TE2. Then, the terminal end TE1, the dummy part DMY, and the terminal end TE2 are arranged in a row in the x-axis direction and the pedestal part PED is formed so as to be parallel with the row. The characteristic of the fifth embodiment is that the electricity supply line ESL is arranged extending in the y-axis direction from the above-described dummy part DMY to the pedestal part PED.

Figure 29:
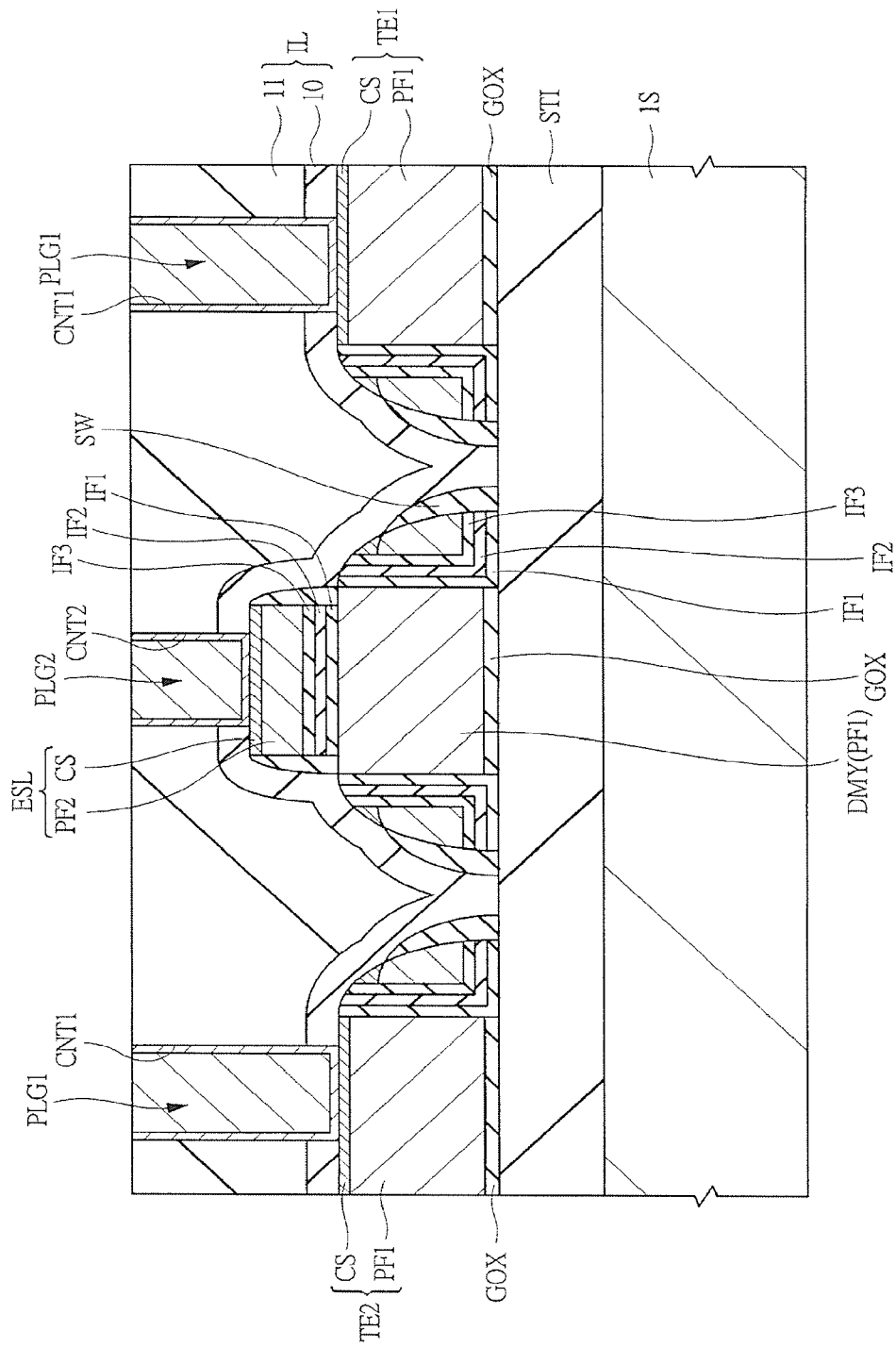
FIG. 29 is a section view cut by A-A line in FIG. 28.

FIG. 29 is a section view cut by A-A line in FIG. 28. As shown in FIG. 29, over the semiconductor substrate 1S, the element isolation region STI is formed and over the element isolation region STI, the terminal end TE1, the terminal end TE2, and the dummy part DMY are formed via the gate insulating film GOX. The dummy part DMY is formed between the terminal end TE1 and the terminal end TE2 shown in FIG. 29. The terminal end TE1, the terminal end TE2, and the dummy part DMY are formed by processing the same polysilicon film PF1. Then, the terminal end TE1 and the terminal end TE2 include the polysilicon film PF1 and the cobalt silicide film CS formed on the surface of the polysilicon film PF1 and the dummy part DMY includes the polysilicon film PF1. The polysilicon film PF1 that constitutes the terminal end TE1, the terminal end TE2, and the dummy part DMY is the same film as that which constitutes the control gate electrode CG1a and the control gate electrode CG2a shown in FIG. 28.

On the sidewall of the terminal end TE1, the sidewall of the terminal end TE2, and the sidewall of the dummy part DMY, the polysilicon film PF2 is formed via a laminated film. At this time, the laminated film includes the silicon oxide film IF1, the silicon nitride film IF2, and the silicon oxide film IF3. Then, over the dummy part DMY, the electricity supply line ESL is arranged via the above-described laminated film. The electricity supply line ESL is formed from the polysilicon film PF2 and the cobalt silicide film CS formed on the surface of the polysilicon film PF1.

Next, as shown in FIG. 29, on the sidewall on both sides of the electricity supply line ESL, the sidewall SW is formed and the interlayer insulating film IL is formed so as to cover the electricity supply line ESL, the terminal end TE1, and the terminal end TE2. The interlayer insulating film IL is formed from, for example, the silicon nitride film 10 and the silicon oxide film 11. Then, in the interlayer insulating film IL, the contact hole CNT1 that reaches the terminal end TE1 and the terminal end TE2 is formed and the plug PLG1 is formed by embedding a conductive material including a titanium/titanium nitride film and a tungsten film in the contact hole CNT1. To the plug PLG1, a wire, not shown schematically, is connected, and thereby, a voltage is supplied to the terminal end TE1 and the terminal end TE2 via the plug PLG1. The terminal end TE1 is electrically connected with the control gate electrode CG1a shown in FIG. 28 and the terminal end TE2 is electrically connected with the control gate electrode CG2a shown in FIG. 28, and therefore, a voltage is supplied from the plug PLG1 to the control gate electrode CG1a via the terminal end TE1 and a voltage is supplied from the plug PLG1 to the control gate electrode CG2a via the terminal end TE2 as a result.

Further, as shown in FIG. 29, in the interlayer insulating film IL, the contact hole CNT2 that reaches the electricity supply line ESL is formed and the plug PLG2 is formed by embedding a conductive material including a titanium/titanium nitride film and a tungsten film in the contact hole CNT2. To the plug PLG2, a wire, not shown schematically, is connected, and thereby, a voltage is supplied to the electricity supply line ESL via the plug PLG2. The electricity supply line ESL is electrically connected with the memory gate electrode MG1b and the memory gate electrode MG2b shown in FIG. 28, and therefore, a voltage is supplied from the plug PLG2 to the memory gate electrode MG1b and the memory gate electrode MG2b via the electricity supply line ESL as a result.

Figure 30:
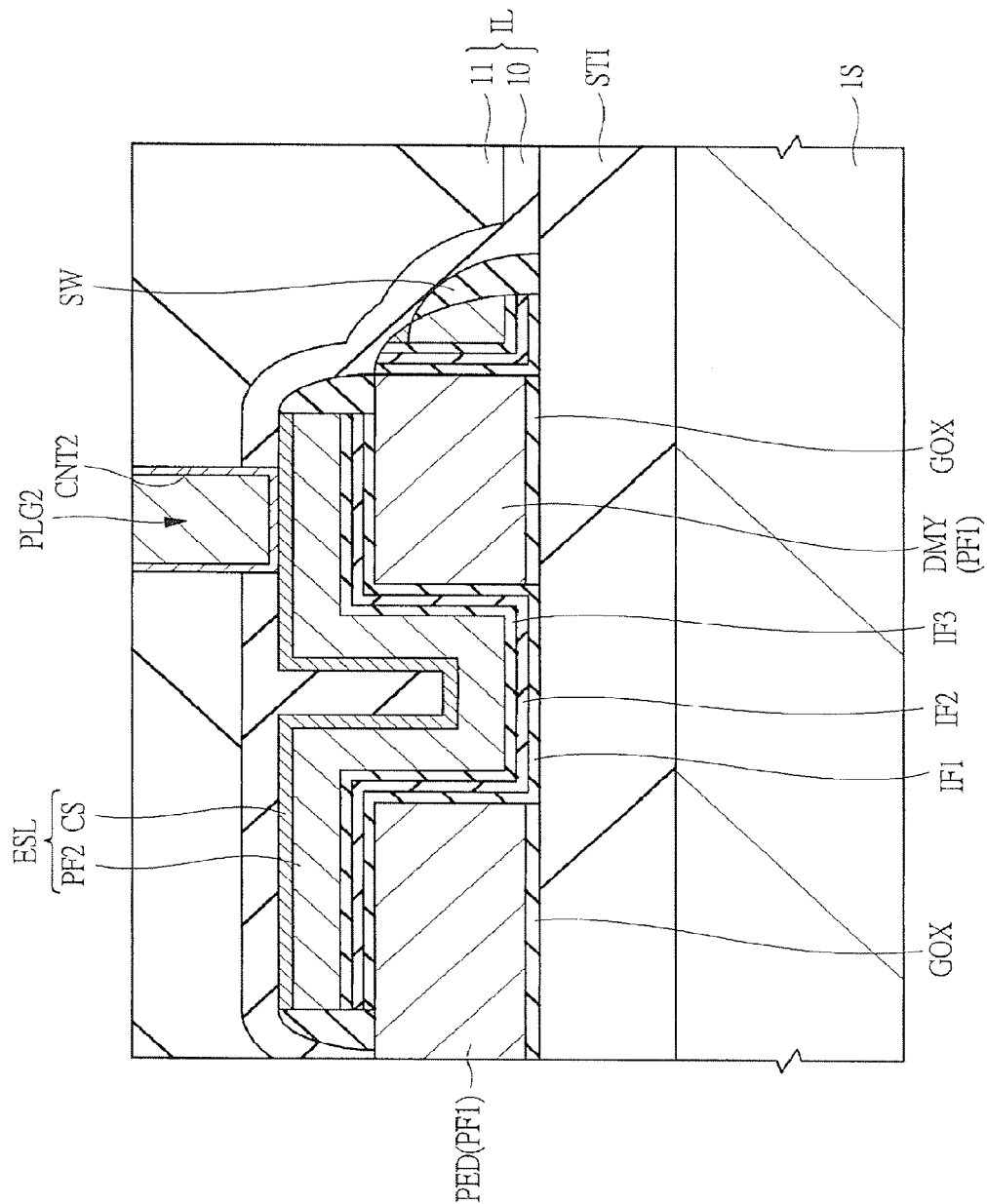
FIG. 30 is a section view cut by B-B line in FIG. 28.

FIG. 30 is a section view cut along B-B line in FIG. 28. As shown in FIG. 30, over the semiconductor substrate 1S, the element isolation region STI is formed and over the element isolation region STI, the pedestal part PED and the dummy part DMY are formed via the gate insulating film GOX. The pedestal part PED and the dummy part DMY are formed from the same polysilicon film PF1. The pedestal part PED and the dummy part DMY are formed so that their heights are substantially the same and the polysilicon film PF1 that constitutes the pedestal part PED and the dummy part DMY is the same film as that which constitutes the control gate electrode CG1b and the control gate electrode CG2b shown in FIG. 28. The width of the pedestal part PED in the y-axis direction is made greater than that of the control gate electrode CG1b in the y-axis direction and that of the control gate electrode CG2b in the y-axis direction.

As shown in FIG. 30, the electricity supply line ESL is formed so as to extend from the pedestal part PED to the dummy part DMY. Specifically, a laminated film is formed so as to cover the side surface and part of the top surface of the dummy part DMY from over the element isolation region STI after passing part of the top surface and the side surface of the pedestal part PED, and the electricity supply line ESL is formed over the laminated film. The laminated film includes the silicon oxide film IF1, the silicon nitride film IF2, and the silicon oxide film IF3. On the other hand, the electricity supply line ESL is formed from the polysilicon PF2 and the cobalt silicide film CS formed on the surface of the polysilicon film PF2. The polysilicon film PF2 constituting the electricity supply line ESL is the same film as that which constitutes the memory gate electrode MG1b and the memory gate electrode MG2b shown in FIG. 28.

Over the semiconductor substrate 1S including over the pedestal part PED and over the electricity supply line ESL, the interlayer insulating film IL is formed. The interlayer insulating film IL is formed from the silicon nitride film 10 and the silicon oxide film 11. Then, the contact hole CNT2 that penetrates through the interlayer insulating film IL and reaches the electricity supply line ESL is formed, and the plug PLG2 is formed by embedding a conductive material including a titanium/titanium nitride film and a tungsten film in the contact hole CNT2. A wire, not shown schematically, is connected to the plug PLG2 and thereby a voltage is supplied to the electricity supply line ESL via the plug PLG2. Over the dummy part DMY, the plug PLG2 is formed via the electricity supply line. The electricity supply line ESL is electrically connected with the memory gate electrode MG1b and the memory gate electrode MG2b shown in FIG. 28, and therefore, a voltage is supplied from the plug PLG2 to the memory gate electrode MG1b and the memory gate electrode MG2b having a sidewall shape via the electricity supply line ESL as a result.

The non-volatile memory semiconductor device in the fifth embodiment is configured as described above and its characteristic will be described as follows. That is, as shown in FIG. 28 and FIG. 30, in the fifth embodiment, one end of the electricity supply line ESL is arranged over the pedestal part PED and the other end of the electricity supply line ESL is arranged over the dummy part DMY. Because of this, the formation is made so that both end portions of the electricity supply line ESL have the same height. This point is a main characteristic of the fifth embodiment.

By making both end portions of the electricity supply line ESL have the same height, the height of the resist film used when patterning the electricity supply line ESL becomes constant. As a result, the out-of-focus state when performing exposure processing of the resist film is eliminated and it is possible to suppress the defect in the shape of the resist film. Consequently, it is possible to form a resist film that reflects the shape of the normal electricity supply line ESL and to perform the normal patterning of the electricity supply line ESL. Because of this, it is possible to ensure the electrical connection between the electricity supply line ESL and the plug PLG2 and to supply electricity to the memory gate electrodes MG1b, MG2b of split gate transistor without fail.

Further, according to the fifth embodiment, the following effect can also be obtained. For example, when the electricity supply line ESL is formed so as to extend in the x-axis direction, the margin of a shift in the y-axis direction is severely limited. Consequently, it is necessary to ensure a margin in the y-axis direction. This means an adjustment of the distance between the plurality of control gate electrodes arranged side by side in the y-axis direction. The adjustment of the distance between the plurality of control gate electrodes arranged side by side in the y-axis direction adversely affects not only the electricity supply region but also the memory cell array region.

In contrast to this, the electricity supply line ESL in the fifth embodiment is formed in the y-axis direction extending from the dummy part DMY to the pedestal part PED. Consequently, when the electricity supply line ESL shifts in position, the margin of a shift in the x-axis direction is severely limited. Because of this, it is necessary to ensure the alignment margin of the electricity supply line ESL in the x-axis direction. This can be dealt with only by adjusting the width of the electricity supply region ESR in the x-axis direction. That is, this can be dealt with only by adjusting the layout configuration of the electricity supply region ESR, and it is not necessary to adjust the layout configuration of the memory cell array region. Because of this, it is possible to obtain the remarkable effect that the alignment margin in the x-axis direction of the electricity supply line ESL can be ensured without the need to considerably modify the layout configuration.

In the above, the invention accomplished by the present inventors has been specifically described based on the embodiments. However, it cannot be overemphasized that the present invention is not restricted to the embodiments, and it can be changed variously in the range which does not deviate from the gist.

The present invention can be broadly used for the manufacturing industry which manufactures a semiconductor device.

What is claimed is:
1. A non-volatile memory semiconductor device, comprising:
   a first memory cell array region;
   a second memory cell array region; and
   an electricity supply region sandwiched by the first memory cell array region and the second memory cell array region over a semiconductor substrate, wherein the first memory cell array region, the second memory cell array region, and the electricity supply region are arranged side by side in a first direction, wherein the device includes
(a) a first control gate electrode extending along the first direction from the first memory cell array region to the electricity supply region and having a first terminal end disposed within the electricity supply region;
(b) a first memory gate electrode formed on a sidewall of the first control gate electrode via a first insulating film and extending in the first direction;
(c) a second control gate electrode extending along the first direction from the second memory cell array region to the electricity supply region and having a second terminal end disposed within the electricity supply region; and
(d) a second memory gate electrode formed on a sidewall of the second control gate electrode via a second insulating film and extending in the first direction, wherein the first control gate electrode and the second control gate electrode are arranged in a straight line and the first terminal end and the second terminal end are arranged separated from each other, wherein the device further comprises
(e) an electricity supply line with one end arranged over the first terminal end and the other end arranged over the second terminal end; and
(f) a plug electrically connected with the electricity supply line, wherein the electricity supply line is formed by processing a first conductive film forming the first memory gate electrode and the second memory gate electrode, wherein the first memory gate electrode and the second memory gate electrode are electrically connected via the electricity supply line, wherein a predetermined voltage is applied to the first memory gate electrode and the second memory gate electrode via the electricity supply line, and wherein the plug is formed over the electricity supply line and is disposed between the first terminal end and the second terminal end in a plan view.

2. The non-volatile memory semiconductor device according to claim 1,
wherein a width at a central portion of the electricity supply line in a second direction is greater than a width at an end portion of the electricity supply line in the second direction, the second direction being substantially perpendicular to the first direction.

3. The non-volatile memory semiconductor device according to claim 1,
wherein the first conductive film comprises a polysilicon film.

4. The non-volatile memory semiconductor device according to claim 3,
wherein the first control gate electrode and the second control gate electrode are formed of a second conductive film.

5. The non-volatile memory semiconductor device according to claim 4,
wherein the second conductive film comprises a polysilicon film.

6. The non-volatile memory semiconductor device according to claim 1,
wherein a first memory cell formed in the first memory cell array region includes
a first gate insulating film formed over the semiconductor substrate;
a first said control gate electrode formed over the first gate insulating film;
a first said memory gate electrode formed on the sidewall of the first control gate electrode;
a first said insulating film formed between the first control gate electrode and the first memory gate electrode and between the first memory gate electrode and the semiconductor substrate;
a first source region formed within the semiconductor substrate; and
a first drain region formed within the semiconductor substrate,
wherein a second memory cell formed in the second memory cell array region includes
a second gate insulating film formed over the semiconductor substrate;
a second said control gate electrode formed over the second gate insulating film;
a second said memory gate electrode formed on the sidewall of the second control gate electrode;
a second said insulating film formed between the second control gate electrode and the second memory gate electrode and between the second memory gate electrode and the semiconductor substrate;
a second source region formed within the semiconductor substrate; and
a second drain region formed within the semiconductor substrate.

7. The non-volatile memory semiconductor device according to claim 6,
wherein the first insulating film and the second insulating film are formed from a laminated film including a first potential barrier film, a charge storage film formed over the first potential barrier film, and a second potential barrier film formed over the charge storage film.

8. The non-volatile memory semiconductor device according to claim 7,
wherein the first potential barrier film and the second potential barrier film are formed from a silicon oxide film, and
wherein the charge storage film is formed from a silicon nitride film.

9. The non-volatile memory semiconductor device according to claim 1,
wherein a height of the first terminal end is the same as a height of the second terminal end.